(12) United States Patent
Park et al.

(10) Patent No.: US 12,255,206 B2
(45) Date of Patent: Mar. 18, 2025

(54) SEMICONDUCTOR DEVICE

(71) Applicant: SAMSUNG ELECTRONICS CO., LTD., Suwon-si (KR)

(72) Inventors: Sungil Park, Suwon-si (KR); Jae Hyun Park, Hwaseong-si (KR); Doyoung Choi, Hwaseong-si (KR); Youngmoon Choi, Suwon-si (KR); Daewon Ha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 465 days.

(21) Appl. No.: 17/699,724

(22) Filed: Mar. 21, 2022

(65) Prior Publication Data
US 2023/0046546 A1 Feb. 16, 2023

(30) Foreign Application Priority Data

Aug. 10, 2021 (KR) .................. 10-2021-0105357

(51) Int. Cl.
| *H01L 27/092* | (2006.01) |
| *H01L 21/02* | (2006.01) |
| *H01L 21/8238* | (2006.01) |
| *H01L 29/06* | (2006.01) |
| *H01L 29/417* | (2006.01) |
| *H01L 29/423* | (2006.01) |
| *H01L 29/66* | (2006.01) |
| *H01L 29/786* | (2006.01) |

(52) U.S. Cl.
CPC ...... *H01L 27/0922* (2013.01); *H01L 21/0259* (2013.01); *H01L 21/823807* (2013.01); *H01L 21/823814* (2013.01); *H01L 21/823871* (2013.01); *H01L 29/0665* (2013.01); *H01L 29/41733* (2013.01); *H01L 29/42392* (2013.01); *H01L 29/66742* (2013.01); *H01L 29/78618* (2013.01); *H01L 29/78696* (2013.01)

(58) Field of Classification Search
None
See application file for complete search history.

(56) References Cited

U.S. PATENT DOCUMENTS

| 9,812,575 | B1 | 11/2017 | Reznicek et al. |
| 10,020,228 | B2 * | 7/2018 | Smith ............ H01L 29/792 |

(Continued)

FOREIGN PATENT DOCUMENTS

| WO | WO-2019183099 A1 * | 9/2019 | ........... H01L 21/027 |

*Primary Examiner* — Cory W Eskridge
(74) *Attorney, Agent, or Firm* — Sughrue Mion, PLLC

(57) ABSTRACT

A semiconductor device includes: an active pattern extending in a first direction on a substrate; a first lower source/drain pattern and a second lower source/drain pattern provided on the active pattern and spaced apart from each other in the first direction; a first upper source/drain pattern provided on the first lower source/drain pattern; a second upper source/drain pattern provided on the second lower source/drain pattern; and a gate electrode crossing the active pattern and extending in a second direction intersecting the first direction. The gate electrode includes an overlapping portion overlapping the active pattern in a third direction perpendicular to the first direction and the second direction. A length of the overlapping portion in the second direction is less than a length of the first lower source/drain pattern in the second direction.

20 Claims, 44 Drawing Sheets

(56) References Cited

U.S. PATENT DOCUMENTS

| | | |
|---|---|---|
| 10,483,166 B1 | 11/2019 | Cheng et al. |
| 10,832,969 B2 | 11/2020 | Miao et al. |
| 10,833,079 B2 | 11/2020 | Yamashita et al. |
| 10,896,851 B2 | 1/2021 | Cheng et al. |
| 2014/0051225 A1* | 2/2014 | Chang ............ H01L 21/823842 |
| | | 257/E21.54 |
| 2019/0386011 A1 | 12/2019 | Weckx et al. |
| 2020/0203341 A1 | 6/2020 | Barraud et al. |
| 2020/0335501 A1 | 10/2020 | Dewey et al. |
| 2020/0395386 A1 | 12/2020 | Lilak et al. |
| 2021/0098500 A1 | 4/2021 | Wang et al. |

* cited by examiner

SEMICONDUCTOR DEVICE

CROSS-REFERENCE TO RELATED APPLICATION

This application claims priority to Korean Patent Application No. 10-2021-0105357, filed on Aug. 10, 2021, in the Korean Intellectual Property Office, the disclosure of which is incorporated by reference herein in its entirety.

BACKGROUND

The present disclosure relates to a semiconductor device, and more particularly, to a semiconductor device including a field effect transistor and a method of manufacturing the same.

A semiconductor device may include an integrated circuit including metal-oxide-semiconductor (MOS) field effect transistors (MOSFETs). As sizes and design rules of semiconductor devices have been reduced, MOS field effect transistors have also been scaled down. Operating characteristics of semiconductor devices may be negatively affected by the scale-down of MOS field effect transistors. Thus, various methods for manufacturing a semiconductor device capable of improving performance while overcoming limitations caused by a high integration density have been studied.

SUMMARY

Example embodiments of the present disclosure may provide a semiconductor device with improved electrical characteristics and reliability.

According to an aspect of an example embodiment, there is provided a semiconductor device including: an active pattern extending in a first direction on a substrate; a first lower source/drain pattern provided on the active pattern; a second lower source/drain pattern provided on the active pattern and spaced apart from the first lower source/drain pattern in the first direction; a first upper source/drain pattern provided on the first lower source/drain pattern; a second upper source/drain pattern provided on the second lower source/drain pattern; and a gate electrode crossing the active pattern and extending in a second direction intersecting the first direction, wherein the gate electrode includes an overlapping portion overlapping the active pattern in a third direction perpendicular to the first direction and the second direction, and wherein a length of the overlapping portion in the second direction is less than a length of the first lower source/drain pattern in the second direction.

According to an aspect of an example embodiment, there is provided a semiconductor device including: an active pattern extending in a first direction on a substrate; a first lower source/drain pattern provided on the active pattern; a second lower source/drain pattern provided on the active pattern and spaced apart from the first lower source/drain pattern in the first direction; a first upper source/drain pattern provided on the first lower source/drain pattern; a second upper source/drain pattern provided the second lower source/drain pattern; a gate electrode crossing the active pattern and extending in a second direction intersecting the first direction; a first channel pattern extending in the first direction to cross the gate electrode, and connecting the first lower source/drain pattern and the second lower source/drain pattern; a second channel pattern extending in the first direction to cross the gate electrode, and connecting the first upper source/drain pattern and the second upper source/drain pattern; a common contact commonly connected to the first lower source/drain pattern and the first upper source/drain pattern; a bottom contact connected to the second lower source/drain pattern; a top contact connected to the second upper source/drain pattern; and a gate contact contacting the gate electrode, wherein at least one of the first channel pattern and the second channel pattern includes a plurality of semiconductor patterns stacked and spaced apart from each other in a third direction perpendicular to a top surface of the substrate, wherein a length, in the second direction, of each of the first upper source/drain pattern and the second upper source/drain pattern is less than a length, in the second direction, of each of the first lower source/drain pattern and the second lower source/drain pattern, wherein the gate electrode includes an overlapping portion overlapping the active pattern along the third direction, and wherein a length of the overlapping portion in the second direction is less than the length of the first lower source/drain pattern in the second direction.

According to an aspect of an example embodiment, there is provided a semiconductor device including: a substrate including a first region, a second region, and a third region between the first region and the second region; an active pattern extending in a first direction on the substrate; a first lower source/drain pattern provided on the active pattern; a second lower source/drain pattern provided on the active pattern and spaced apart from the first lower source/drain pattern in the first direction; a first upper source/drain pattern provided on the first lower source/drain pattern; a second upper source/drain pattern provided on the second lower source/drain pattern; and a gate electrode crossing the active pattern on the third region and extending in a second direction intersecting the first direction, wherein the active pattern has a first length in the second direction on the first region, wherein the active pattern has a second length in the second direction on the second region, wherein the active pattern has a third length in the second direction on the third region, and wherein the third length is less than the first length and the second length.

According to an aspect of an example embodiment, there is provided a semiconductor device including: an active pattern extending in a first direction on a substrate; a first lower source/drain pattern provided on the active pattern; a second lower source/drain pattern provided on the active pattern and spaced apart from the first lower source/drain pattern in the first direction; a first upper source/drain pattern provided on the first lower source/drain pattern; a second upper source/drain pattern provided on the second lower source/drain pattern; a gate electrode crossing the active pattern and extending in a second direction intersecting the first direction; a first channel pattern extending in the first direction to cross the gate electrode, and connecting the first lower source/drain pattern and the second lower source/drain pattern; and a second channel pattern provided on the first channel pattern, extending in the first direction to cross the gate electrode, and connecting the first upper source/drain pattern and the second upper source/drain pattern, wherein the first channel pattern includes a plurality of lower semiconductor patterns stacked and spaced apart from each other in a third direction perpendicular to a top surface of the substrate, wherein the second channel pattern includes a plurality of upper semiconductor patterns stacked and spaced apart from each other in the third direction, wherein the gate electrode includes an overlapping portion overlapping the active pattern along the third direction, and wherein a length of the overlapping portion in the second direction is less than a length of the first lower source/drain pattern in the second direction.

BRIEF DESCRIPTION OF THE DRAWINGS

The above and other aspects will be more apparent from the following description of example embodiments taken in conjunction with the accompanying drawings, in which.

DETAILED DESCRIPTION

Example embodiments will now be described more fully with reference to the accompanying drawings.

Figure 1A:
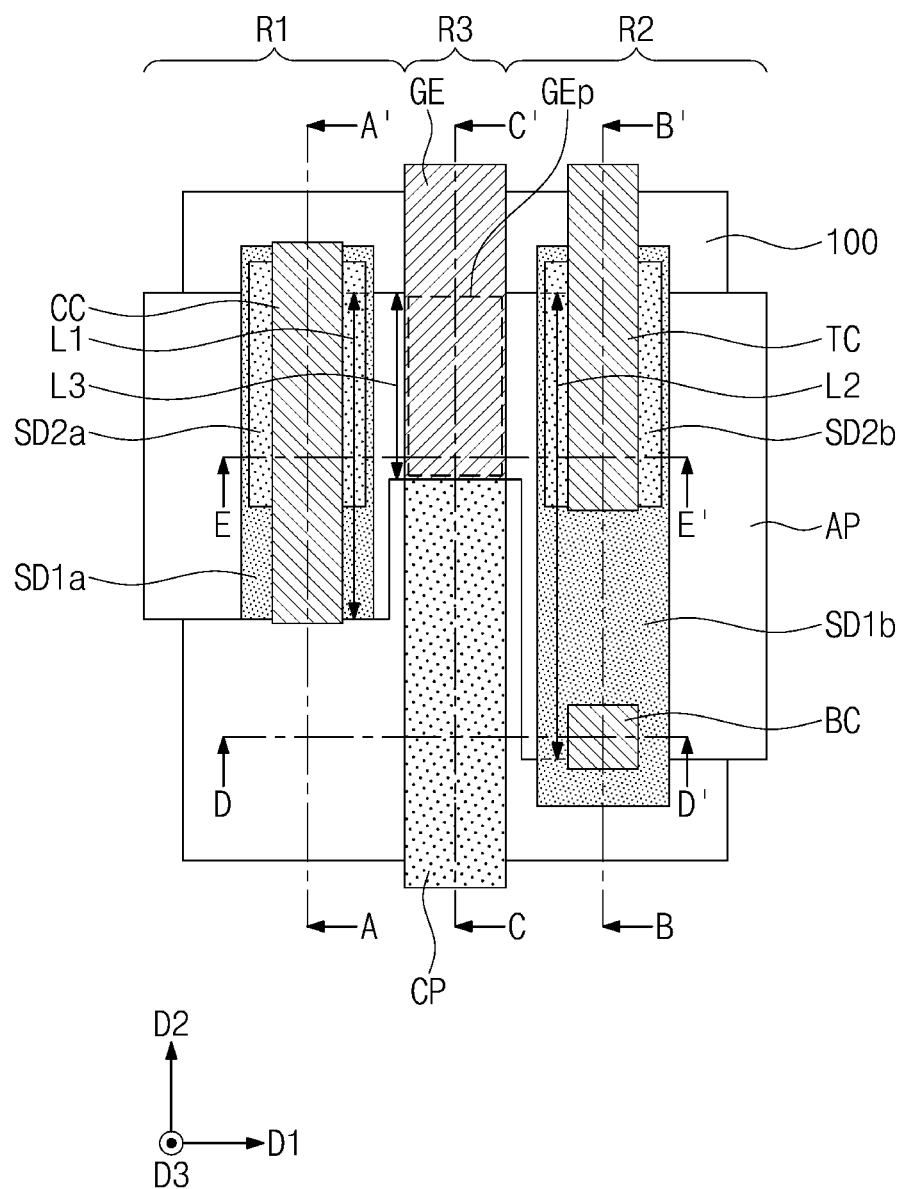
FIG. 1A is a plan view illustrating a semiconductor device according to some example embodiments.

FIG. 1A is a plan view illustrating a semiconductor device according to some example embodiments. FIGS. 1B, 1C, 1D, 1E and 1F are cross-sectional views taken along lines A-A', B-B', C-C', D-D' and E-E' of FIG. 1A, respectively, to illustrate a semiconductor device according to some example embodiments.

Referring to FIGS. 1A, 1B, 1C, 1D, 1E and 1F, a substrate 100 including an active pattern AP may be provided. For example, the substrate 100 may be a semiconductor substrate including at least one of silicon (Si), germanium (Ge) or silicon-germanium (SiGe), or a compound semiconductor substrate. For example, the substrate 100 may be a silicon substrate. A top surface of the substrate 100 may be parallel to a first direction D1 and a second direction D2, and may be perpendicular to a third direction D3. The first direction D1, the second direction D2 and the third direction D3 may be perpendicular to each other.

The substrate 100 may include a first region R1, a second region R2, and a third region R3 between the first region R1 and the second region R2. The first region R1 and the second region R2 may be spaced apart from each other with the third region R3 interposed therebetween in the first direction D1. Each of the first to third regions R1, R2 and R3 may extend in the second direction D2. The first to third regions R1, R2 and R3 may be regions on which a standard cell constituting a logic circuit is provided. For example, transistors provided on the first to third regions R1, R2 and R3 may be logic transistors.

A device isolation layer ST may be provided on the substrate 100, and the device isolation layer ST may define the active pattern AP. The device isolation layer ST may cover a side surface of the active pattern AP and may expose a top surface of the active pattern AP. For example, the device isolation layer ST may include at least one of silicon oxide, silicon nitride, or silicon oxynitride. The active pattern AP may correspond to an upper portion of the substrate 100 surrounded by the device isolation layer ST.

As shown in FIG. 1A, the active pattern AP may have a first length L1 in the second direction D2 on the first region R1, may have a second length L2 in the second direction D2 on the second region R2, and may have a third length L3 in the second direction D2 on the third region R3. For example, the lengths, in the second direction D2, of the active pattern AP on the first to third regions R1, R2 and R3 may be different from each other. The first length L1 may be less than the second length L2 and may be greater than the third length L3. In the present disclosure, the length of the active pattern AP in the second direction D2 may indicate a length of the top surface of the active pattern AP in the second direction D2.

Figure 1B:
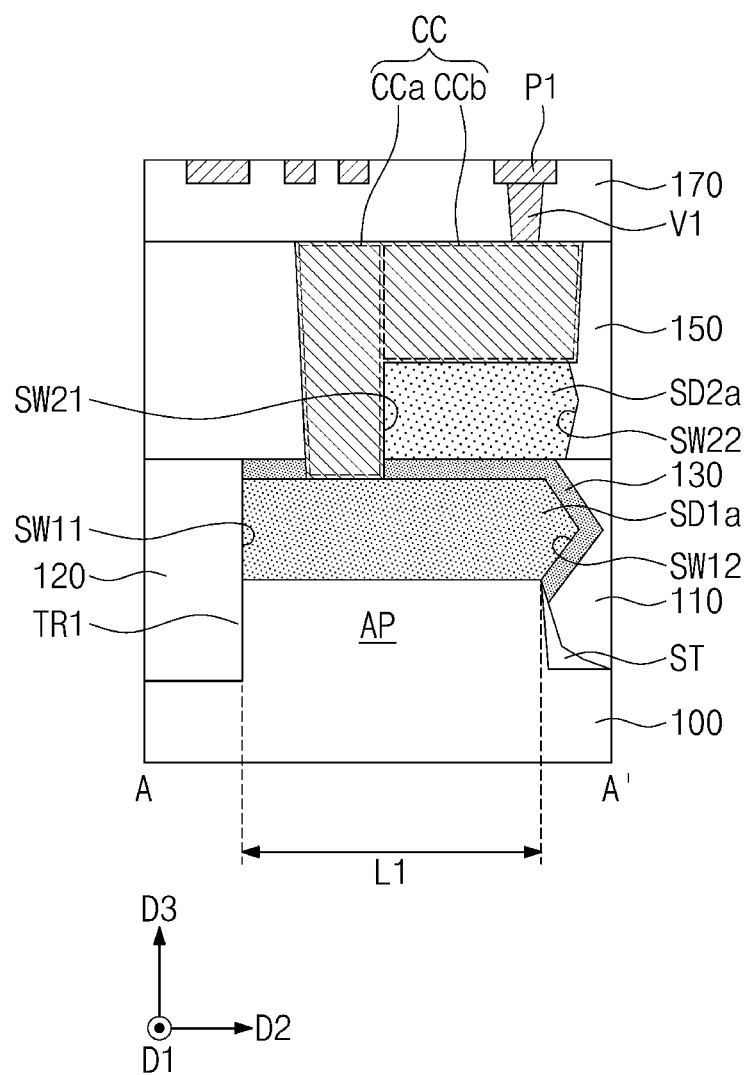
FIGS. 1B, 1C, 1D, 1E and 1F are cross-sectional views taken along lines A-A', B-B', C-C', D-D' and E-E' of FIG. 1A, respectively, to illustrate a semiconductor device according to some example embodiments.
Figure 1C:
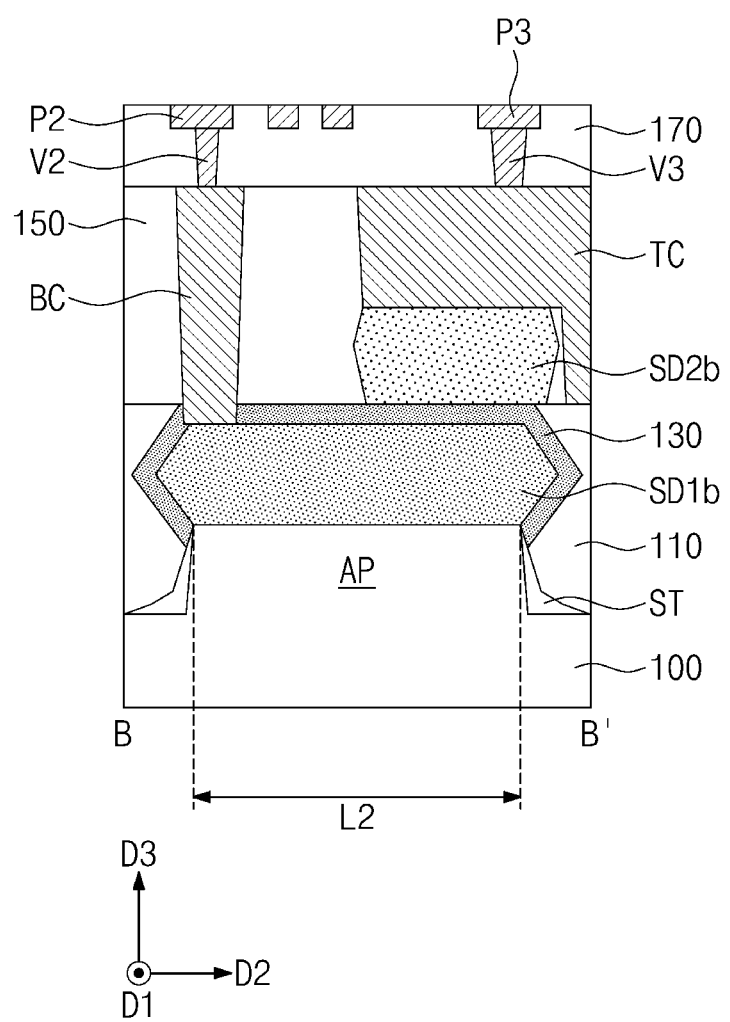
Figure 1D:
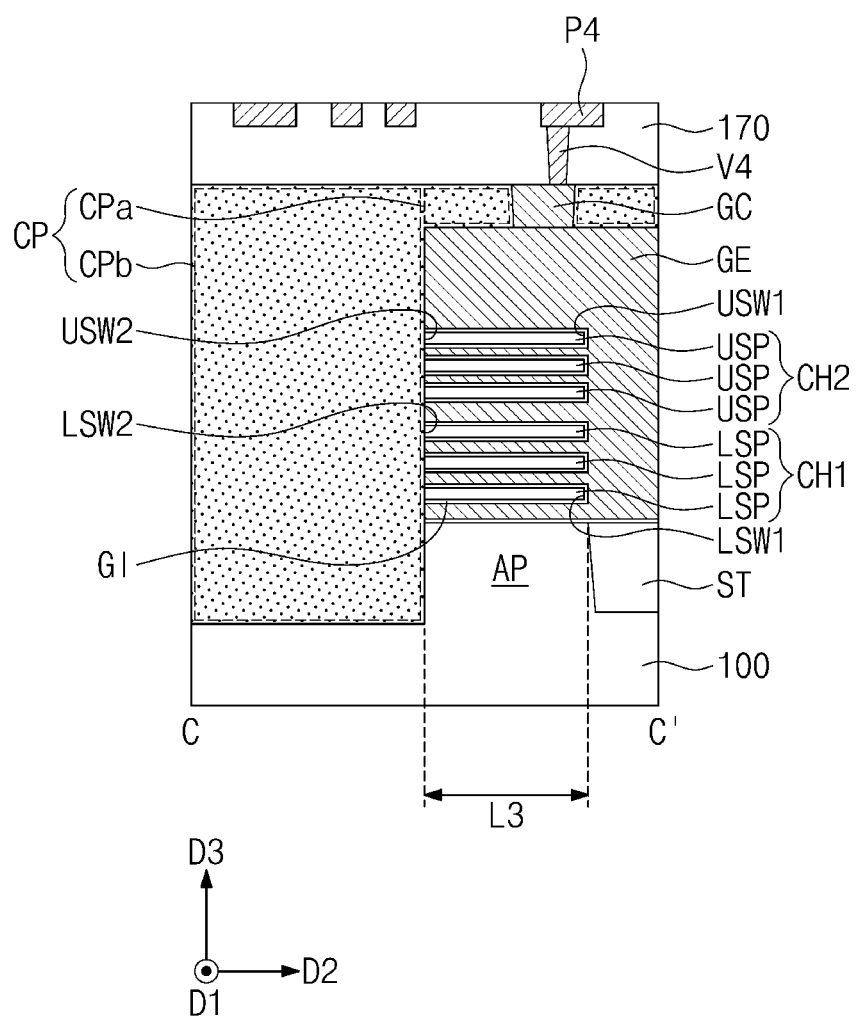
Figure 1E:
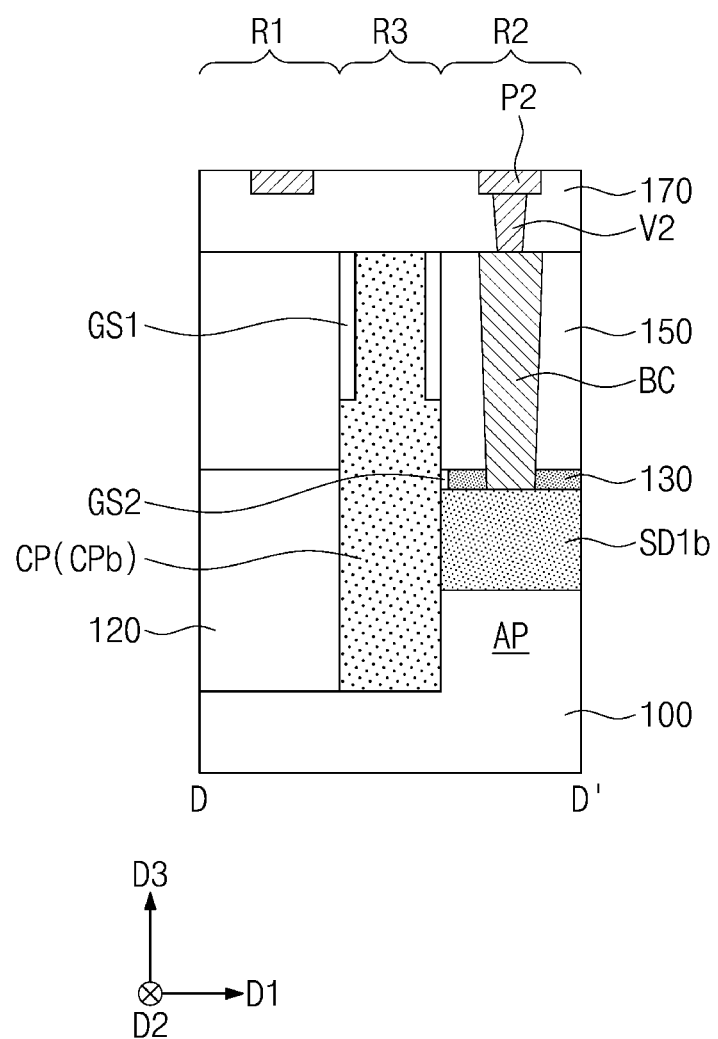
Figure 1F:
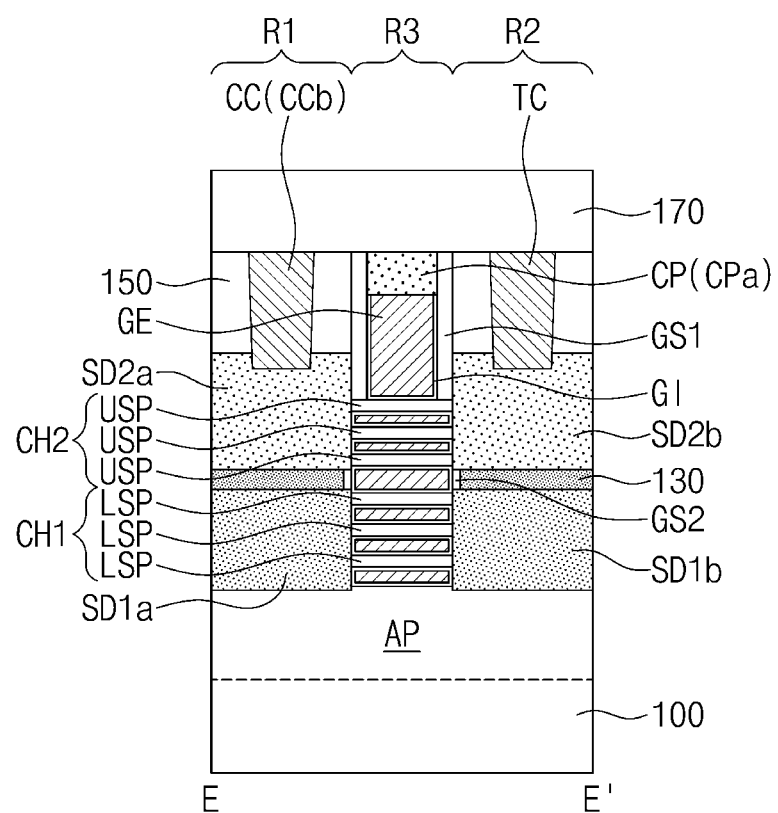

Referring to FIGS. 1B and 1C, the first length L1 may correspond to a length in the second direction D2 at a bottom surface of a first lower source/drain pattern SD1*a*. The second length L2 may correspond to a length in the second direction D2 at a bottom surface of a second lower source/drain pattern SD1*b*.

A first channel pattern CH1 and a second channel pattern CH2 may be provided on the active pattern AP of the substrate 100. The first channel pattern CH1 and the second channel pattern CH2 may be sequentially stacked in the third direction D3 perpendicular to the top surface of the substrate 100. A topmost surface of the substrate 100 may correspond to the top surface of the active pattern AP.

In some example embodiments, the first channel pattern CH1 may include a plurality of lower semiconductor patterns LSP sequentially stacked in the third direction D3. The lower semiconductor patterns LSP may be spaced apart from each other in the third direction D3. For example, a bottommost one of the lower semiconductor patterns LSP may be spaced apart from an upper portion of the active pattern AP. The lower semiconductor patterns LSP may include at least one of, for example, silicon (Si), germanium (Ge), or silicon-germanium (SiGe).

In some example embodiments, the second channel pattern CH2 may include a plurality of upper semiconductor patterns USP sequentially stacked in the third direction D3. The upper semiconductor patterns USP may be spaced apart from each other in the third direction D3. A bottommost one of the upper semiconductor patterns USP may be spaced apart from a topmost one of the lower semiconductor patterns LSP in the third direction D3. For example, the upper semiconductor patterns USP may include at least one of silicon (Si), germanium (Ge), or silicon-germanium (SiGe).

Each of the lower semiconductor patterns LSP and the upper semiconductor patterns USP may extend in the first direction D1 and the second direction D2 on the active pattern AP in parallel to the top surface of the substrate 100.

A pair of lower source/drain patterns SD1a and SD1b extending in the second direction D2 may be provided on the active pattern AP of the substrate 100. The pair of lower source/drain patterns SD1a and SD1b may be provided at both sides of the first channel pattern CH1 and may be in contact with the lower semiconductor patterns LSP of the first channel pattern CH1. The pair of lower source/drain patterns SD1a and SD1b may include a first lower source/drain pattern SD1a provided on the first region R1 and a second lower source/drain pattern SD1b provided on the second region R2. The first lower source/drain pattern SD1a and the second lower source/drain pattern SD1b may be spaced apart from each other in the first direction D1, with a gate electrode GE to be described later (or a capping pattern CP to be described later) interposed therebetween.

A width of the first lower source/drain pattern SD1a in the first direction D1 may be substantially equal to a width of the second lower source/drain pattern SD1b in the first direction D1.

A length of the first lower source/drain pattern SD1a in the second direction D2 may be less than a length of the second lower source/drain pattern SD1b in the second direction D2. The length of the first lower source/drain pattern SD1a in the second direction D2 may be less than the second length L2 and may be greater than the third length L3. In the present disclosure, the length of each of the first and second lower source/drain patterns SD1a and SD1b in the second direction D2 may indicate a maximum length of each of the first and second lower source/drain patterns SD1a and SD1b in the second direction D2. Each of the first and second lower source/drain patterns SD1a and SD1b may have the maximum length in the second direction D2 at a level between its top and bottom surfaces.

The first and second lower source/drain patterns SD1a and SD1b may include epitaxial patterns formed using the substrate 100 and the lower semiconductor patterns LSP as a seed. For example, the first and second lower source/drain patterns SD1a and SD1b may include at least one of silicon (Si), silicon-germanium (SiGe), or silicon carbide (SiC). The first and second lower source/drain patterns SD1a and SD1b may be formed to provide tensile strain or compressive strain to the lower semiconductor patterns LSP of the first channel pattern CH1.

A first insulating layer 110 covering at least one side surface of each of the first and second lower source/drain patterns SD1a and SD1b may be provided on the substrate 100. The first insulating layer 110 may be provided on the device isolation layer ST. A second insulating layer 120 covering a side surface of the first lower source/drain pattern SD1a may be provided on the substrate 100. The second insulating layer 120 may be in contact with the substrate 100.

More particularly, a first side surface SW11 of the first lower source/drain pattern SD1a may have a flat profile. For example, the first side surface SW11 of the first lower source/drain pattern SD1a may be parallel to the third direction D3. The first side surface SW11 of the first lower source/drain pattern SD1a may be aligned with a side surface of the active pattern AP. The first side surface SW11 of the first lower source/drain pattern SD1a may be in direct contact with the second insulating layer 120.

A second side surface SW12 of the first lower source/drain pattern SD1a may have a profile convex in the second direction D2. The second side surface SW12 of the first lower source/drain pattern SD1a may not be parallel to the first side surface SW11 and may not be aligned with another side surface of the active pattern AP. The second side surface SW12 of the first lower source/drain pattern SD1a may be covered with the first insulating layer 110. The first side surface SW11 and the second side surface SW12 of the first lower source/drain pattern SD1a may be opposite to each other in the second direction D2.

Both side surfaces of the second lower source/drain pattern SD1b may not be in contact with the second insulating layer 120 and may be covered with the first insulating layer 110.

A third insulating layer 130 may be provided on the first and second lower source/drain patterns SD1a and SD1b and the first insulating layer 110. The third insulating layer 130 may cover a top surface of each of the first and second lower source/drain patterns SD1a and SD1b and may extend in the second direction D2. The third insulating layer 130 may extend along the second side surface SW12 of the first lower source/drain pattern SD1a and the both side surfaces of the second lower source/drain pattern SD1b. The third insulating layer 130 may also be disposed between each of the first and second lower source/drain patterns SD1a and SD1b and the first insulating layer 110. A topmost surface of the third insulating layer 130 may be substantially coplanar with top surfaces of the first insulating layer 110 and the second insulating layer 120. The third insulating layer 130 may be in contact with a side surface of the device isolation layer ST.

Each of the first to third insulating layers 110, 120 and 130 may include at least one of silicon oxide, silicon nitride, or silicon oxynitride. For example, the first and second insulating layers 110 and 120 may include the same insulating material. For example, the third insulating layer 130 may include an insulating material different from that of the first and second insulating layers 110 and 120. For example, the first and second insulating layers 110 and 120 may include silicon oxide, and the third insulating layer 130 may include silicon nitride.

A pair of upper source/drain patterns SD2a and SD2b extending in the second direction D2 may be provided on the third insulating layer 130. The pair of upper source/drain patterns SD2a and SD2b may be provided at both sides of the second channel pattern CH2 and may be in contact with the upper semiconductor patterns USP of the second channel pattern CH2. The pair of upper source/drain patterns SD2a and SD2b may include a first upper source/drain pattern SD2a provided on the first region R1 and a second upper source/drain pattern SD2b provided on the second region R2. The first upper source/drain pattern SD2a and the second upper source/drain pattern SD2b may be spaced apart from each other in the first direction D1 with a gate electrode GE, to be described later, interposed therebetween. The first and second upper source/drain patterns SD2a and SD2b may be spaced apart from the first and second lower source/drain patterns SD1a and SD1b in the third direction D3 with the third insulating layer 130 interposed therebetween.

A width of the first upper source/drain pattern SD2a in the first direction D1 may be substantially equal to a width of the second upper source/drain pattern SD2b in the first direction D1. The width of each of the first and second upper source/drain patterns SD2a and SD2b in the first direction D1 may be equal to or less than the width of each of the first and second lower source/drain patterns SD1a and SD1b in the first direction D1.

A length of the first upper source/drain pattern SD2a in the second direction D2 may be equal to or less than a length of the second upper source/drain pattern SD2b in the second direction D2. The length of each of the first and second upper source/drain patterns SD2a and SD2b in the second direction D2 may be less than the first length L1. For example, the length of each of the first and second upper source/drain patterns SD2a and SD2b in the second direction D2 may be greater than the third length L3. In the present disclosure, the length of each of the first and second upper source/drain patterns SD2a and SD2b in the second direction D2 may indicate a maximum length of each of the first and second upper source/drain patterns SD2a and SD2b in the second direction D2. Each of the first and second upper source/drain patterns SD2a and SD2b may have the maximum length in the second direction D2 at a level between top and bottom surfaces thereof.

The first and second upper source/drain patterns SD2a and SD2b may include epitaxial patterns formed using the upper semiconductor patterns USP as a seed. For example, the first and second upper source/drain patterns SD2a and SD2b may include at least one of silicon (Si), silicon-germanium (SiGe), or silicon carbide (SiC). The first and second upper source/drain patterns SD2a and SD2b may be formed to provide tensile strain or compressive strain to the upper semiconductor patterns USP of the second channel pattern CH2.

The first and second upper source/drain patterns SD2a and SD2b may have a conductivity type different from that of the first and second lower source/drain patterns SD1a and SD1b. For example, the first and second lower source/drain patterns SD1a and SD1b may have a first conductivity type (e.g., a p-type or n-type), and the first and second upper source/drain patterns SD2a and SD2b may have a second conductivity type (e.g., an n-type or p-type). For example, the first and second upper source/drain patterns SD2a and SD2b may include dopants different from those of the first and second lower source/drain patterns SD1a and SD1b.

A fourth insulating layer 150 covering at least one side surface of each of the first and second upper source/drain patterns SD2a and SD2b may be provided on the second insulating layer 120 and the third insulating layer 130. A bottom surface of the fourth insulating layer 150 may be substantially coplanar with bottom surfaces of the first and second upper source/drain patterns SD2a and SD2b. A top surface of the fourth insulating layer 150 may be located at a higher level than top surfaces of the first and second upper source/drain patterns SD2a and SD2b. For example, the fourth insulating layer 150 may include at least one of silicon oxide, silicon nitride, or silicon oxynitride.

More particularly, a first side surface SW21 of the first upper source/drain pattern SD2a may have a flat profile. For example, the first side surface SW21 of the first upper source/drain pattern SD2a may be parallel to the third direction D3. The first side surface SW21 of the first upper source/drain pattern SD2a may be in contact with and aligned with a side surface of a first portion CCa of a common contact CC to be described later.

A second side surface SW22 of the first upper source/drain pattern SD2a may have a profile convex in the second direction D2. The second side surface SW22 of the first upper source/drain pattern SD2a may not be parallel to the first side surface SW21 and may not be aligned with a side surface of a second portion CCb of a common contact CC to be described later. The second side surface SW22 of the first upper source/drain pattern SD2a may be covered with the fourth insulating layer 150. The first side surface SW21 and the second side surface SW22 of the first upper source/drain patterns SD2a may be opposite to each other in the second direction D2.

Both side surfaces of the second upper source/drain pattern SD2b may be covered with the fourth insulating layer 150.

A gate electrode GE covering the active pattern AP and extending in the second direction D2 may be provided on the third region R3. The gate electrode GE may overlap with the lower semiconductor patterns LSP of the first channel pattern CH1 and the upper semiconductor patterns USP of the second channel pattern CH2 in the third direction D3 and may surround them.

The gate electrode GE may include an overlapping portion GEp overlapping with the active pattern AP in the third direction D3. A length of the overlapping portion GEp in the second direction D2 may be substantially equal to the third length L3 of the active pattern AP in the second direction D2 on the third region R3. The length of the overlapping portion GEp in the second direction D2 may be less than the length of each of the first and second lower source/drain patterns SD1a and SD1b in the second direction D2.

More particularly, the gate electrode GE may cover a top surface and a bottom surface of each of the lower and upper semiconductor patterns LSP and USP of the first and second channel patterns CH1 and CH2. The gate electrode GE may cover a first side surface LSW1 of each of the lower semiconductor patterns LSP and a first side surface USW1 of each of the upper semiconductor patterns USP. A second side surface LSW2 of each of the lower semiconductor patterns LSP and a second side surface USW2 of each of the upper semiconductor patterns USP may not be covered by the gate electrode GE and may be in contact with a second portion CPb of a capping pattern CP to be described later. The first side surface LSW1 and the second side surface LSW2 of each of the lower semiconductor patterns LSP may be opposite to each other in the second direction D2. The first side surface USW1 and the second side surface USW2 of each of the upper semiconductor patterns USP may be opposite to each other in the second direction D2.

For example, the gate electrode GE may include a doped semiconductor material, a conductive metal nitride, and/or a metal. More particularly, the gate electrode GE may include a plurality of metal patterns different from each other. For example, the gate electrode GE may include a first metal pattern surrounding the lower semiconductor patterns LSP of the first channel pattern CH1, a second metal pattern surrounding the upper semiconductor patterns USP of the second channel pattern CH2, and a third metal pattern provided on a topmost one of the upper semiconductor patterns USP. Resistances of the first to third metal patterns may be different from each other. Desired threshold voltages of a lower transistor and an upper transistor may be obtained by adjusting a composition and a thickness of each of the first to third metal patterns.

The first and second lower source/drain patterns SD1a and SD1b may be provided at both sides of the gate electrode GE, respectively, and the first and second upper source/drain patterns SD2a and SD2b may also be provided at both sides of the gate electrode GE, respectively. As shown in FIG. 1A, at least a portion of each of the first and second lower source/drain patterns SD1a and SD1b and the first and second upper source/drain patterns SD2a and SD2b may overlap with the gate electrode GE in the first direction D1.

A gate insulating pattern GI may be provided between the gate electrode GE and the active pattern AP and between the gate electrode GE and each of the lower and upper semiconductor patterns LSP and USP of the first and second channel patterns CH1 and CH2. A pair of first gate spacers GS1 may be provided to extend from a top surface of the topmost one of the upper semiconductor patterns USP of the second channel pattern CH2 in the third direction D3 and to cover portions of both side surfaces of the gate electrode GE. A pair of second gate spacers GS2 may be provided to extend in the third direction D3 between the top surface of each of the first and second lower source/drain patterns SD1a and SD1b and the bottom surface of each of the first and second upper source/drain patterns SD2a and SD2b and to cover other portions of the both side surfaces of the gate electrode GE. A capping pattern CP covering a topmost surface of the gate electrode GE may be provided. The gate electrode GE, the gate insulating pattern GI, the first and second gate spacers GS1 and GS2 and the capping pattern CP may be collectively referred to as a gate structure.

The gate insulating pattern GI may extend along a bottom surface of the gate electrode GE and may be disposed between the gate electrode GE and the device isolation layer ST. For example, the gate insulating pattern GI may extend from the top surface of the active pattern AP onto the top surface of the device isolation layer ST in the second direction D2.

The gate insulating pattern GI may be disposed between the gate electrode GE and each of the lower and upper semiconductor patterns LSP and USP of the first and second channel patterns CH1 and CH2. The gate insulating pattern GI may surround the top surface, the bottom surface and the first side surface LSW1 of each of the lower semiconductor patterns LSP. The gate insulating pattern GI may surround the top surface, the bottom surface and the first side surface USW1 of each of the upper semiconductor patterns USP. Each of the lower and upper semiconductor patterns LSP and USP may be spaced apart from the gate electrode GE with the gate insulating pattern GI interposed therebetween.

The gate insulating pattern GI covering the top surface and the bottom surface of each of the lower and upper semiconductor patterns LSP and USP may extend between the gate electrode GE and each of the first and second lower source/drain patterns SD1a and SD1b and between the gate electrode GE and each of the first and second upper source/drain patterns SD2a and SD2b. Each of the first and second lower source/drain patterns SD1a and SD1b and the first and second upper source/drain patterns SD2a and SD2b may be spaced apart from the gate electrode GE in the first direction D1 with the gate insulating pattern GI interposed therebetween.

The gate insulating pattern GI may be disposed between the gate electrode GE and the topmost one of the upper semiconductor patterns USP of the second channel pattern CH2 and may extend between the gate electrode GE and the first gate spacers GS1. A topmost surface of the gate insulating pattern GI may be substantially coplanar with the topmost surface of the gate electrode GE.

For example, the gate insulating pattern GI may include at least one of silicon oxide, silicon nitride, silicon oxynitride, or a high-k dielectric material. The high-k dielectric material may be a material of which a dielectric constant is greater than those of silicon oxide and silicon nitride, for example, hafnium oxide (HfO), aluminum oxide (AlO) or tantalum oxide (TaO).

The pair of first gate spacers GS1 may extend from the both side surfaces of the gate electrode GE onto both side surfaces of a first portion CPa of the capping pattern CP in the third direction D3. A top surface of each of the pair of first gate spacers GS1 may be located at a higher level than the topmost surface of the gate electrode GE and may be substantially coplanar with a top surface of the capping pattern CP. The pair of first gate spacers GS1 may be spaced apart from each other in the first direction D1 with the gate electrode GE and/or the capping pattern CP interposed therebetween.

The pair of second gate spacers GS2 may be provided between the third insulating layer 130 and the gate electrode GE, and between the third insulating layer 130 and a second portion CPb of the capping pattern CP. A bottom surface of each of the pair of second gate spacers GS2 may be in contact with one of the first and second lower source/drain patterns SD1a and SD1b and may be substantially coplanar with a bottom surface of the third insulating layer 130. A top surface of each of the pair of second gate spacers GS2 may be in contact with one of the first and second upper source/drain patterns SD2a and SD2b, and may be substantially coplanar with a top surface of the third insulating layer 130. Each of the pair of second gate spacers GS2 may not overlap with the pair of first gate spacers GS1 in the third direction D3. Alternatively, in certain example embodiments, the second gate spacers GS2 may be provided between the bottommost one of the upper semiconductor patterns USP and the topmost one of the lower semiconductor patterns LSP and may overlap with the first gate spacers GS1 in the third direction D3, respectively.

The capping pattern CP may include a first portion CPa covering the topmost surface of the gate electrode GE and extending in the second direction D2, and a second portion CPb covering a side surface of the gate electrode GE and the top surface of the substrate 100. The first portion CPa and the second portion CPb of the capping pattern CP may be connected to each other in the second direction D2. The capping pattern CP may be provided on the third region R3.

The first portion CPa of the capping pattern CP may be in contact with the topmost surface of the gate insulating pattern GI. A thickness, in the third direction D3, of the first portion CPa of the capping pattern CP may be less than a distance from the top surface of the topmost one of the upper semiconductor patterns USP to the topmost surface of the gate electrode GE.

The second portion CPb of the capping pattern CP may be in contact with the gate insulating pattern GI covering the top surface and the bottom surface of each of the lower and upper semiconductor patterns LSP and USP. The second portion CPb of the capping pattern CP may be in direct contact with the second side surface LSW2 of each of the lower semiconductor patterns LSP and the second side surface USW2 of each of the upper semiconductor patterns USP. A thickness, in the third direction D3, of the second portion CPb of the capping pattern CP may be greater than the thickness of the first portion CPa in the third direction D3 and greater than a maximum thickness of the gate electrode GE in the third direction D3. A bottom surface of the second portion CPb of the capping pattern CP may be located at a lower level than the top surface of the active pattern AP. For example, the bottom surface of the second portion CPb of the capping pattern CP may be located at a lower level than the topmost surface of the substrate 100. A top surface of the second portion CPb of the capping pattern CP may be located at substantially the same level as the top surface of the first portion CPa, the top surface of each of the pair of first gate spacers GS1, and the top surface of the fourth insulating layer 150.

For example, each of the first and second gate spacers GS1 and GS2 and the capping pattern CP may include at least one of silicon oxide, silicon nitride, or silicon oxynitride. In some example embodiments, the capping pattern CP may include an insulating material different from those of the first, second and fourth insulating layers 110, 120 and 150. In particular, the capping pattern CP may include a material having an etch selectivity with respect to the first, second and fourth insulating layers 110, 120 and 150. For example, the capping pattern CP may include silicon nitride.

The gate electrode GE, the first channel pattern CH1, and the first and second lower source/drain patterns SD1$a$ and SD1$b$ may constitute a lower transistor, and the gate electrode GE, the second channel pattern CH2 and the first and second upper source/drain patterns SD2$a$ and SD2$b$ may constitute an upper transistor. The upper transistor may be an NMOS field effect transistor when the lower transistor is a PMOS field effect transistor, and the upper transistor may be a PMOS field effect transistor when the lower transistor is an NMOS field effect transistor.

In some example embodiments, each of the lower transistor and the upper transistor may be a three-dimensional field effect transistor (or a gate-all-around (GAA) type transistor) in which the gate electrode GE three-dimensionally surrounds a channel. The lower transistor and the upper transistor may be sequentially stacked in the third direction D3 on the substrate 100, and the semiconductor device according to example embodiments may be referred to as a stacked transistor.

Referring again to FIGS. 1A and 1B, a common contact CC may be provided on the first region R1, and the common contact CC may penetrate the third insulating layer 130 and the fourth insulating layer 150 so as to be in contact with the first lower source/drain pattern SD1$a$ and the first upper source/drain pattern SD2$a$.

The common contact CC may include a first portion CCa penetrating the third insulating layer 130 and the fourth insulating layer 150 so as to be in contact with the top surface of the first lower source/drain pattern SD1$a$, and a second portion CCb penetrating the fourth insulating layer 150 so as to be in contact with the top surface of the first upper source/drain pattern SD2$a$. A bottom surface of the first portion CCa of the common contact CC may be located at a lower level than a bottom surface of the second portion CCb. A height, in the third direction D3, of the first portion CCa of the common contact CC may be greater than a height of the second portion CCb in the third direction D3. A side surface of the first portion CCa of the common contact CC may be in contact with the first side surface SW21 of the first upper source/drain pattern SD2$a$.

Referring again to FIGS. 1A and 1C, a bottom contact BC may penetrate the third insulating layer 130 and the fourth insulating layer 150 on the second region R2 so as to be in contact with the top surface of the second lower source/drain pattern SD1$b$, and a top contact TC may penetrate the fourth insulating layer 150 on the second region R2 so as to be in contact with the top surface of the second upper source/drain pattern SD2$b$.

The bottom contact BC may be spaced apart from the top contact TC in the second direction D2 with the fourth insulating layer 150 interposed therebetween. A bottom surface of the bottom contact BC may be located at a lower level than a bottommost surface of the top contact TC. A height of the bottom contact BC in the third direction D3 may be greater than a maximum height of the top contact TC in the third direction D3.

A portion of the top contact TC may be adjacent to a side surface of the second upper source/drain pattern SD2$b$ and may extend in the third direction D3. However, example embodiments are not limited thereto.

As shown in FIG. 1A, the bottom contact BC may not overlap with the common contact CC in the first direction D1, and a portion of the top contact TC may overlap with the common contact CC in the first direction D1. The bottom contact BC may overlap with the capping pattern CP in the first direction D1, and a portion of the top contact TC may overlap with the gate electrode GE in the first direction D1.

Referring again to FIGS. 1A and 1D, a gate contact GC penetrating the first portion CPa of the capping pattern CP so as to be in contact with the top surface of the gate electrode GE may be provided on the third region R3.

Each of the common contact CC, the bottom contact BC, the top contact TC and the gate contact GC may include a conductive pattern and a bather pattern surrounding the conductive pattern. For example, the conductive pattern may include a metal. The barrier pattern may cover a side surface and a bottom surface of the conductive pattern. The barrier pattern may include a metal layer and/or a metal nitride layer.

A fifth insulating layer 170 may be provided to cover top surfaces of the fourth insulating layer 150, the capping pattern CP, the common contact CC, the bottom contact BC, the top contact TC and the gate contact GC. First to fourth pads P1, P2, P3 and P4 connected to the common contact CC, the bottom contact BC, the top contact TC and the gate contact GC, respectively, and first to fourth vias V1, V2, V3 and V4 connecting the common contact CC, the bottom contact BC, the top contact TC and the gate contact GC to the first to fourth pads P1, P2, P3 and P4, respectively, may be provided in the fifth insulating layer 170. The first to fourth pads P1, P2, P3 and P4 and the first to fourth vias V1, V2, V3 and V4 may include a conductive material such as a metal. Each of the first to fourth pads P1, P2, P3 and P4 and each of the first to fourth vias V1, V2, V3 and V4 may be formed in a single conductive structure by a dual damascene process. Metal layers may be additionally stacked on the fifth insulating layer 170.

Figure 2A:
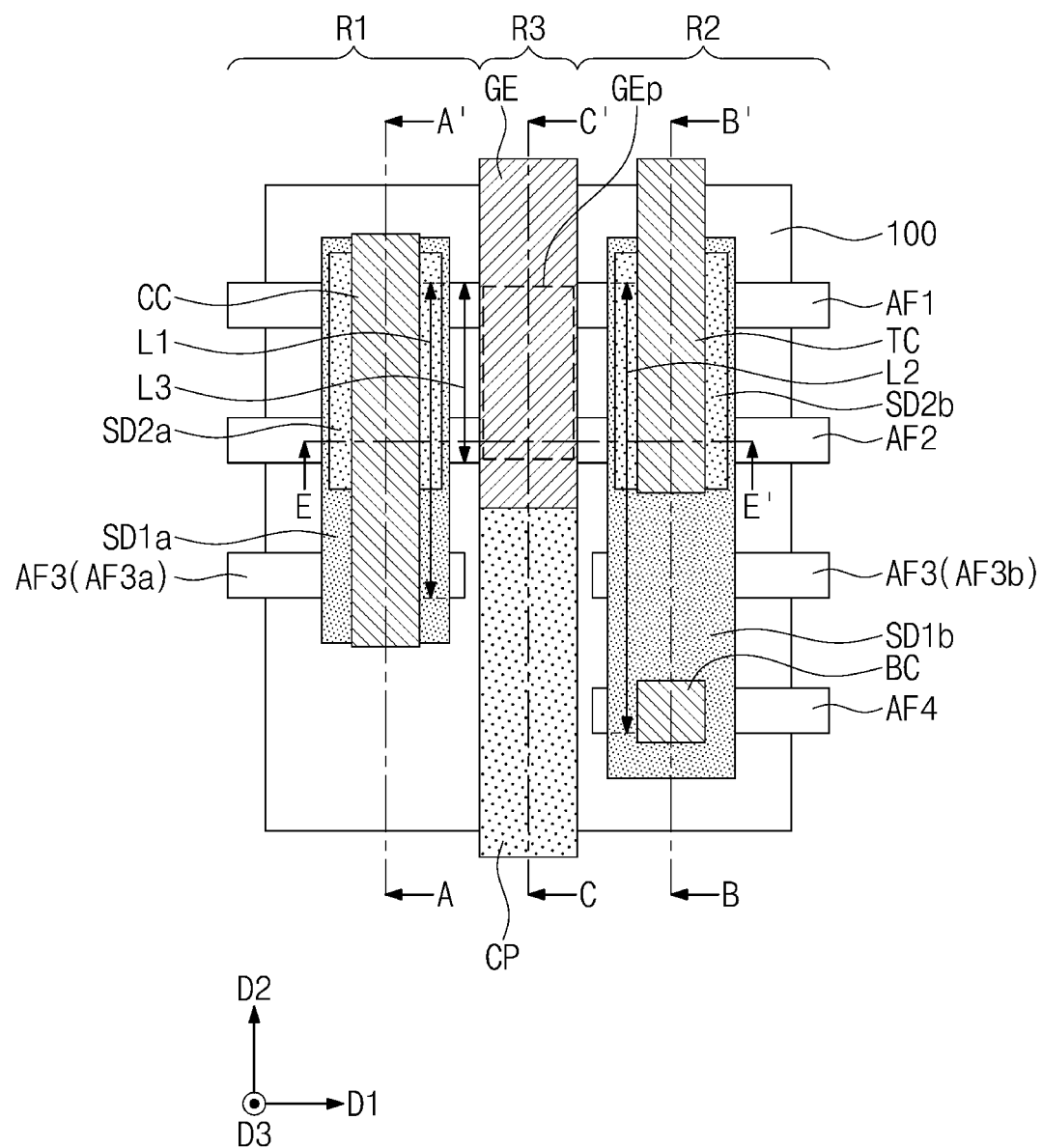
FIG. 2A is a plan view illustrating a semiconductor device according to some example embodiments.

FIG. 2A is a plan view illustrating a semiconductor device according to some example embodiments. FIGS. 2B, 2C, 2D and 2E are cross-sectional views taken along lines A-A', B-B', C-C' and E-E' of FIG. 2A, respectively, to illustrate a semiconductor device according to some example embodiments. Hereinafter, for the purpose of ease and convenience in explanation, the descriptions to the same technical features as in the above example embodiments will be omitted, and differences between the above-described example embodiments will be mainly described.

Referring to FIGS. 2A, 2B, 2C and 2D, an active pattern AP may include a plurality of active fins defined by the device isolation layer ST. In particular, the active pattern AP may include first to fourth active fins AF1, AF2, AF3 and AF4 defined by the device isolation layer ST.

The first to fourth active fins AF1, AF2, AF3 and AF4 may be portions of the substrate 100 and may be portions protruding in the third direction D3. Each of the first to fourth active fins AF1, AF2, AF3 and AF4 may have a fin shape protruding in the third direction D3. A lower transistor using at least a portion of the first to fourth active fins AF1, AF2, AF3 and AF4 as a channel may be a fin field effect transistor (Fin FET).

The first to fourth active fins AF1, AF2, AF3 and AF4 may extend in the first direction D1 and may be spaced apart from each other in the second direction D2. For example, each of the first to fourth active fins AF1, AF2, AF3 and AF4 may have a width in the second direction D2, which decreases as a level in the third direction D3 increases.

The third active fin AF3 may include a first portion AF3a and a second portion AF3b, which are spaced apart from each other in the first direction D1 with the capping pattern CP interposed therebetween. The third active fin AF3 may not be provided on the second region R2. The first portion AF3a of the third active fin AF3 may be provided on the first region R1, and the second portion AF3b of the third active fin AF3 may be provided on the second region R2.

The fourth active fin AF4 may be locally provided on the second region R2. For example, the fourth active fin AF4 may not be provided on the first region R1 and the third region R3. The fourth active fin AF4 may overlap with the second portion AF3b of the third active fin AF3 in the second direction D2. The fourth active fin AF4 may be disposed adjacent to the capping pattern CP.

As shown in FIG. 2A, a length, in the second direction D2, of the active pattern AP including the first active fin AF1, the second active fin AF2 and the first portion AF3a of the third active fin AF3 which are provided on the first region R1 may be defined as a first length L1. A length, in the second direction D2, of the active pattern AP including the first active fin AF1, the second active fin AF2, the second portion AF3b of the third active fin AF3 and the fourth active fin AF4 which are provided on the second region R2 may be defined as a second length L2. A length, in the second direction D2, of the active pattern AP including the first active fin AF1 and the second active fin AF2 which are provided on the third region R3 may be defined as a third length L3. For example, the lengths, in the second direction D2, of the active pattern AP on the first to third regions R1, R2 and R3 may be different from each other. The first length L1 may be less than the second length L2 and may be greater than the third length L3.

Figure 2B:
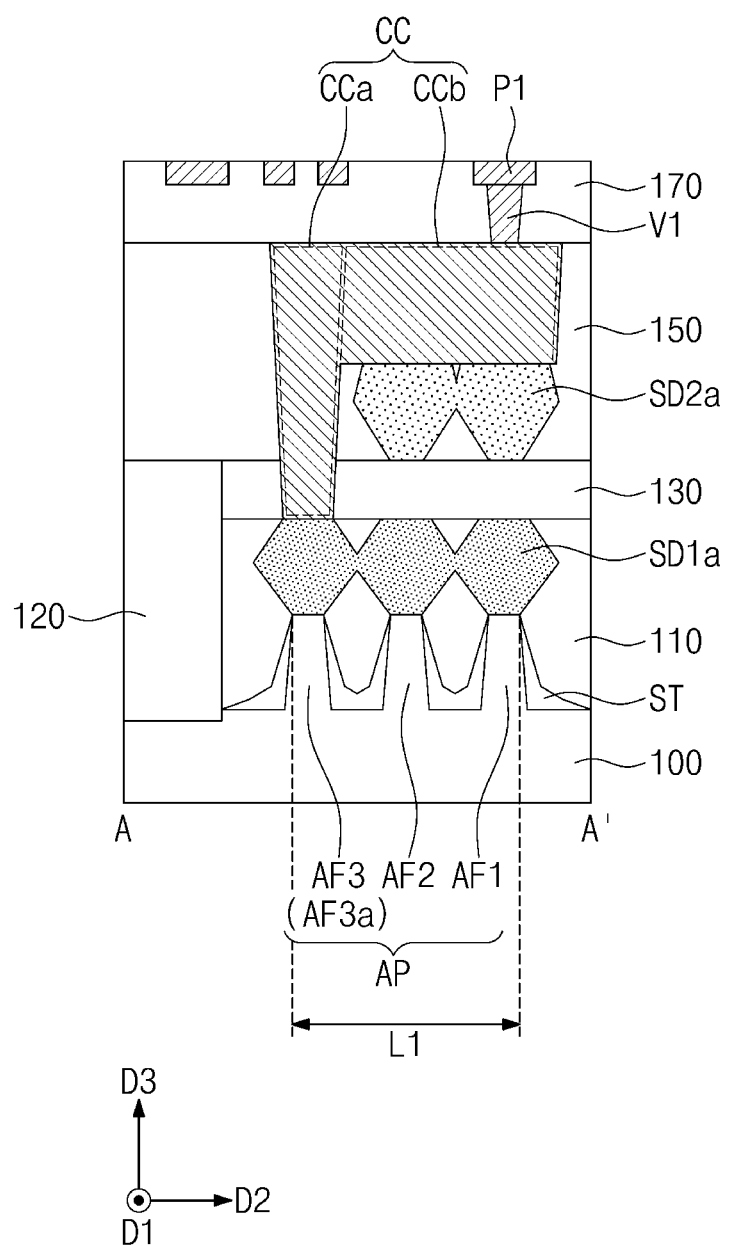
FIGS. 2B, 2C, 2D and 2E are cross-sectional views taken along lines A-A', B-B', C-C' and E-E' of FIG. 2A, respectively, to illustrate a semiconductor device according to some example embodiments.
Figure 2C:
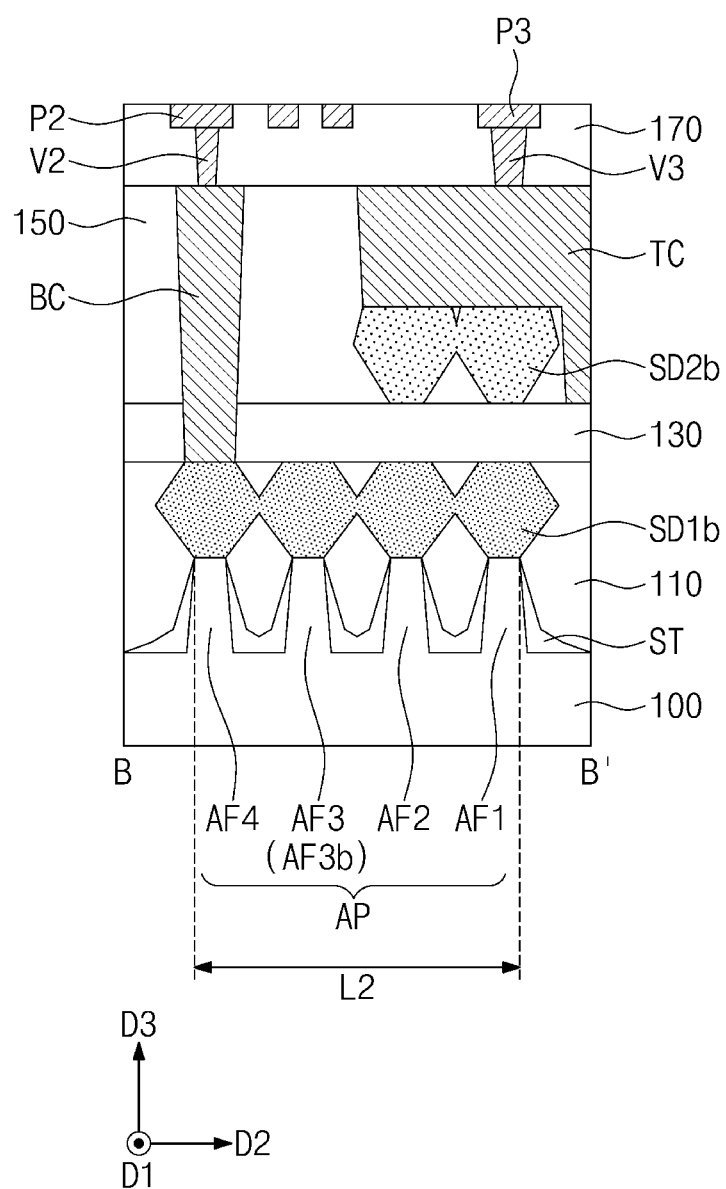

Referring to FIGS. 2B and 2C, the first length L1 may correspond to a length in the second direction D2 at a bottom surface of a first lower source/drain pattern SD1a. The second length L2 may correspond to a length in the second direction D2 at a bottom surface of a second lower source/drain pattern SD1b.

On the third region R3, upper portions of the first and second active fins AF1 and AF2 may be covered with the gate electrode GE, and the upper portions of the first and second active fins AF1 and AF2 overlapping with the gate electrode GE in the second direction D2 may be collectively referred to as a first channel pattern CH1.

A second channel pattern CH2 extending in the third direction D3 may be provided on the first channel pattern CH1. The second channel pattern CH2 may overlap with the first channel pattern CH1 in the third direction D3. The second channel pattern CH2 may be spaced apart from the first channel pattern CH1 in the third direction D3. The second channel pattern CH2 may include two portions provided on the first active fin AF1 and the second active fin AF2, respectively, and the two portions may be spaced apart from each other in the second direction D2. The first channel pattern CH1 and the second channel pattern CH2 may extend in the first direction D1.

On the first region R1, the first lower source/drain pattern SD1a may be provided on top surfaces of the first active fin AF1, the second active fin AF2 and the first portion AF3a of the third active fin AF3. On the second region R2, the second lower source/drain pattern SD1b may be provided on top surfaces of the first active fin AF1, the second active fin AF2, the second portion AF3b of the third active fin AF3 and the fourth active fin AF4.

The first and second lower source/drain patterns SD1a and SD1b may be provided at both sides of the first channel pattern CH1 and may be in contact with side surfaces of the first channel pattern CH1. A length of the first lower source/drain pattern SD1a in the second direction D2 may be less than a length of the second lower source/drain pattern SD1b in the second direction D2.

A first insulating layer 110 may be provided to cover the first and second lower source/drain patterns SD1a and SD1b. The first insulating layer 110 may fill spaces between the device isolation layer ST and the first and second lower source/drain patterns SD1a and SD1b. A second insulating layer 120 spaced apart from a side surface of the first lower source/drain pattern SD1a in the second direction D2 and spaced apart from a side surface of the second lower source/drain pattern SD1b in the first direction D1 may be provided on the first region R1 of the substrate 100. Alternatively, in certain example embodiments, the second insulating layer 120 may be in contact with a side surface of the first lower source/drain pattern SD1a.

A third insulating layer 130 may be provided on the first and second lower source/drain patterns SD1a and SD1b and the first insulating layer 110. The first insulating layer 110 may fill the space between each of the first and second lower source/drain patterns SD1a and SD1b and the third insulating layer 130. Alternatively, in certain example embodiments, the third insulating layer 130 may conformally cover a top surface and a side surface of each of the first and second lower source/drain patterns SD1a and SD1b, and in this case, the first insulating layer 110 may not be disposed between each of the first and second lower source/drain patterns SD1a and SD1b and the third insulating layer 130.

First and second upper source/drain patterns SD2a and SD2b extending in the second direction D2 may be provided on the third insulating layer 130. Each of the first and second upper source/drain patterns SD2a and SD2b may overlap with the first active fin AF1 and the second active fin AF2 in the third direction D3. Each of the first and second upper source/drain patterns SD2a and SD2b may not overlap with the third active fin AF3 in the third direction D3.

The first and second upper source/drain patterns SD2a and SD2b may be provided at both sides of the second channel pattern CH2 and may be in contact with side surfaces of the second channel pattern CH2. A length of the first upper source/drain pattern SD2a in the second direction D2 may be substantially equal to a length of the second upper source/drain pattern SD2b in the second direction D2.

The gate electrode GE covering the first active fin AF1 and the second active fin AF2 and extending in the second direction D2 may be provided on the third region R3. The gate electrode GE may overlap with the first channel pattern CH1 and the second channel pattern CH2 in the third direction D3. The gate electrode GE may surround the second channel pattern CH2. More particularly, the gate electrode GE may cover a portion of both side surfaces and the top surface of each of the first and second active fins AF1 and AF2 referred to as the first channel pattern CH1, and may cover a top surface, a bottom surface and both side surfaces of the second channel pattern CH2. The gate insulating pattern GI may be disposed between each of the first and second channel patterns CH1 and CH2 and the gate electrode GE.

The gate electrode GE may include an overlapping portion GEp overlapping with the first and second active fins AF1 and AF2 in the third direction D3. The overlapping portion GEp of the gate electrode GE may include a first portion overlapping with the top surface of the first active fin AF1 in the third direction D3, a second portion overlapping with the top surface of the second active fin AF2 in the third direction D3, and a third portion between the first portion and the second portion.

Referring again to FIGS. 2A and 2B, a first portion CCa of the common contact CC may be provided on the first portion AF3a of the third active fin AF3, and a second portion CCb of the common contact CC may be provided on the first and second active fins AF1 and AF2.

Referring again to FIGS. 2A and 2C, the bottom contact BC may be provided on the fourth active fin AF4, and the top contact TC may be provided on the first and second active fins AF1 and AF2.

Figure 2D:
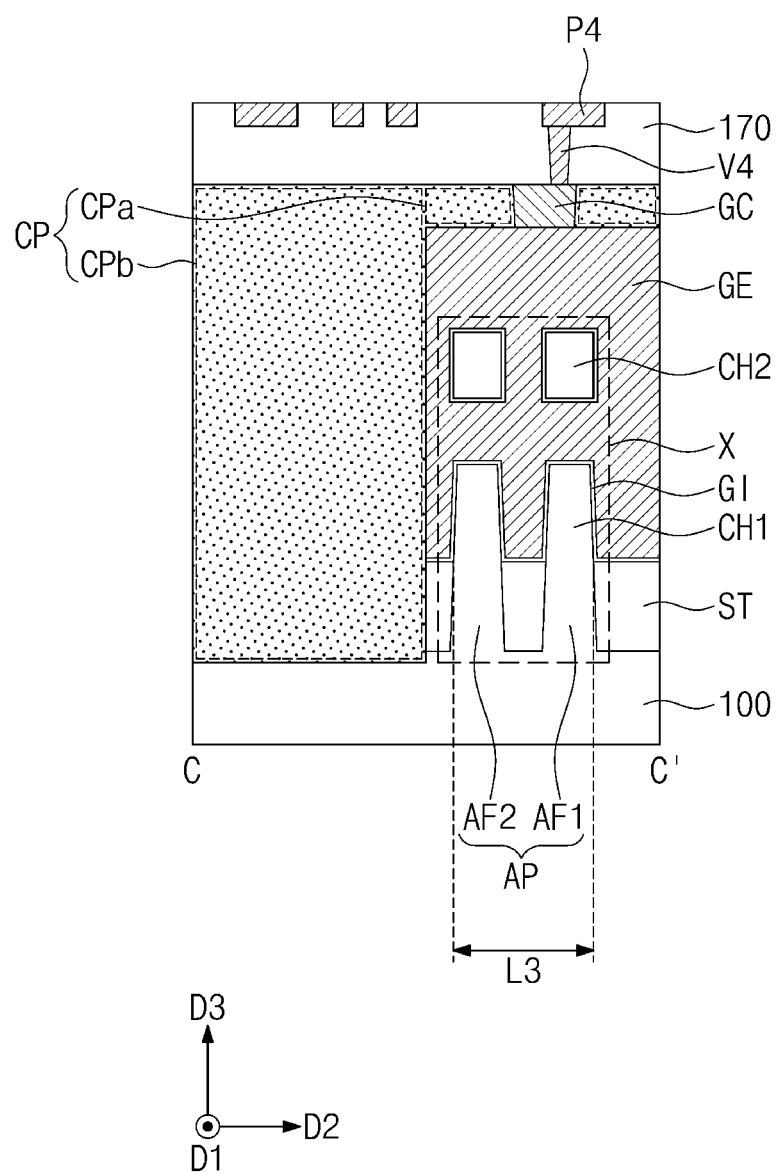
Figure 2E:
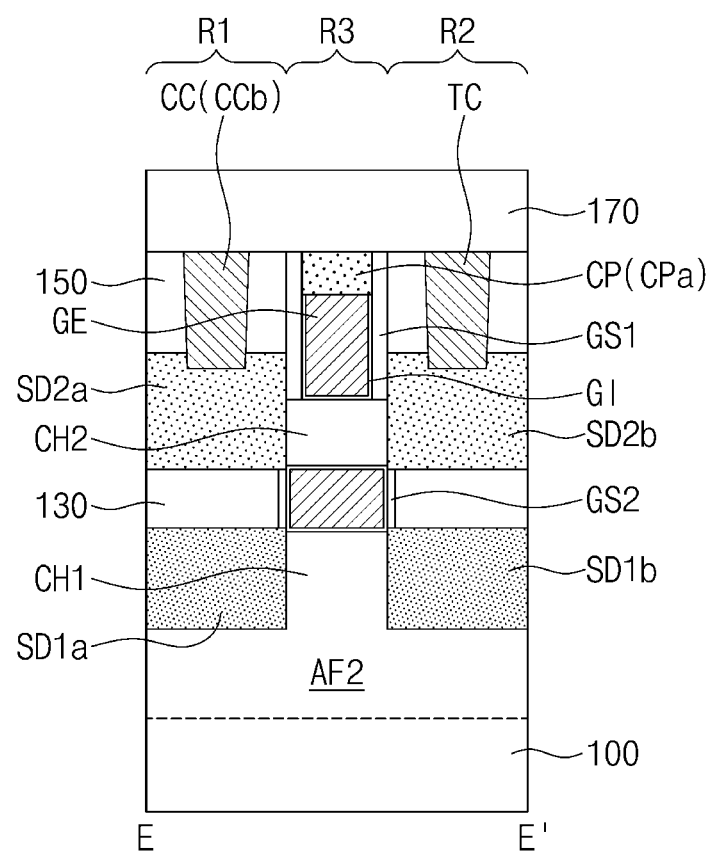
Figure 3:
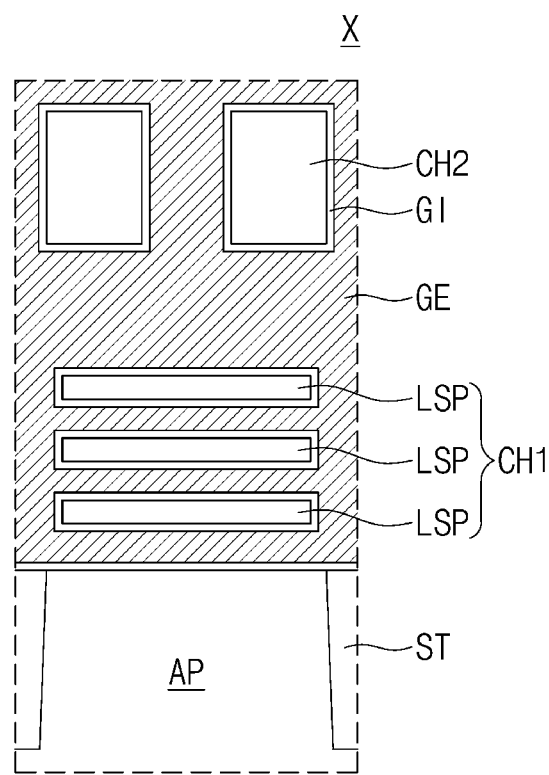
FIGS. 3, 4 and 5 are enlarged views corresponding to a portion 'X' of FIG. 2D to illustrate portions of semiconductor devices according to some example embodiments.
Figure 3:
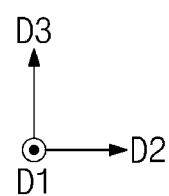
Figure 4:
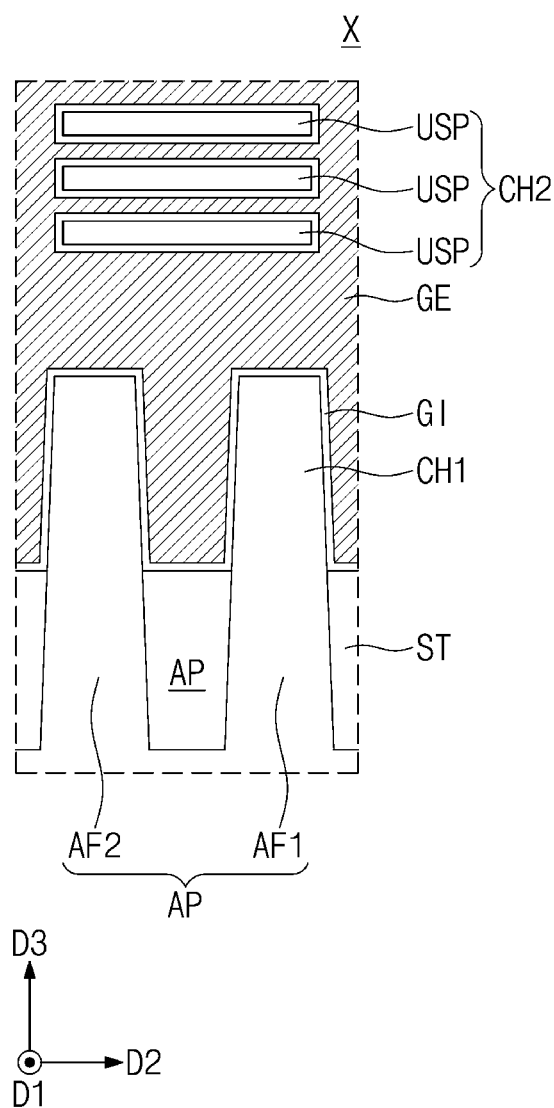
Figure 5:
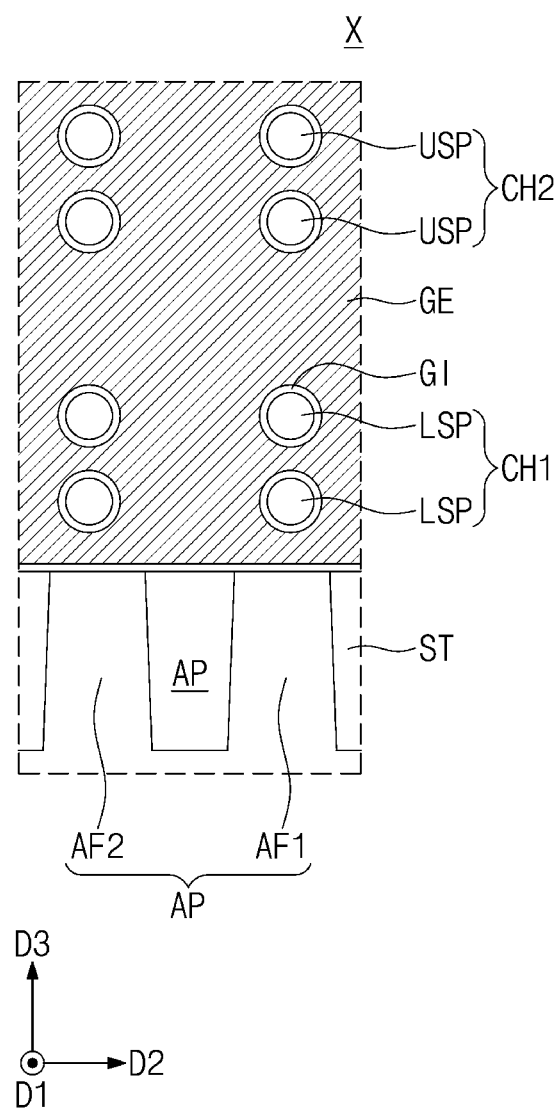

FIGS. 3, 4 and 5 are enlarged views corresponding to a portion 'X' of FIG. 2D to illustrate portions of semiconductor devices according to some example embodiments. Hereinafter, for the purpose of ease and convenience in explanation, the descriptions to the same technical features as in the above-described example embodiments will be omitted, and differences between the above-described example embodiments will be mainly described.

Referring to FIG. 3, a first channel pattern CH1 may include a plurality of lower semiconductor patterns LSP sequentially stacked in the third direction D3 on the active pattern AP. A second channel pattern CH2 extending in the third direction D3 may be provided on the first channel pattern CH1. The second channel pattern CH2 may include two portions provided on the first channel pattern CH1, and the two portions may be spaced apart from each other in the second direction D2.

Referring to FIG. 4, a second channel pattern CH2 including a plurality of upper semiconductor patterns USP sequentially stacked in the third direction D3 may be provided on the top surfaces of the first and second active fins AF1 and AF2 referred to as the first channel pattern CH1. A bottommost one of the upper semiconductor patterns USP of the second channel pattern CH2 may be spaced apart from the first and second active fins AF1 and AF2 in the third direction D3.

Referring to FIG. 5, a plurality of lower semiconductor patterns LSP and a plurality of upper semiconductor patterns USP, which are sequentially stacked in the third direction D3, may be provided on a top surface of each of first and second active fins AF1 and AF2. For example, the top surfaces of the first and second active fins AF1 and AF2 may be substantially coplanar with a top surface of the device isolation layer ST. Each of the lower and upper semiconductor patterns LSP and USP may have a wire shape having a circular cross-section and extending in the first direction D1. The lower and upper semiconductor patterns LSP and USP provided on the top surface of each of the first and second active fins AF1 and AF2 may be spaced apart from each other in the third direction D3. Each of the lower and upper semiconductor patterns LSP and USP may be surrounded by the gate electrode GE.

Figure 6A:
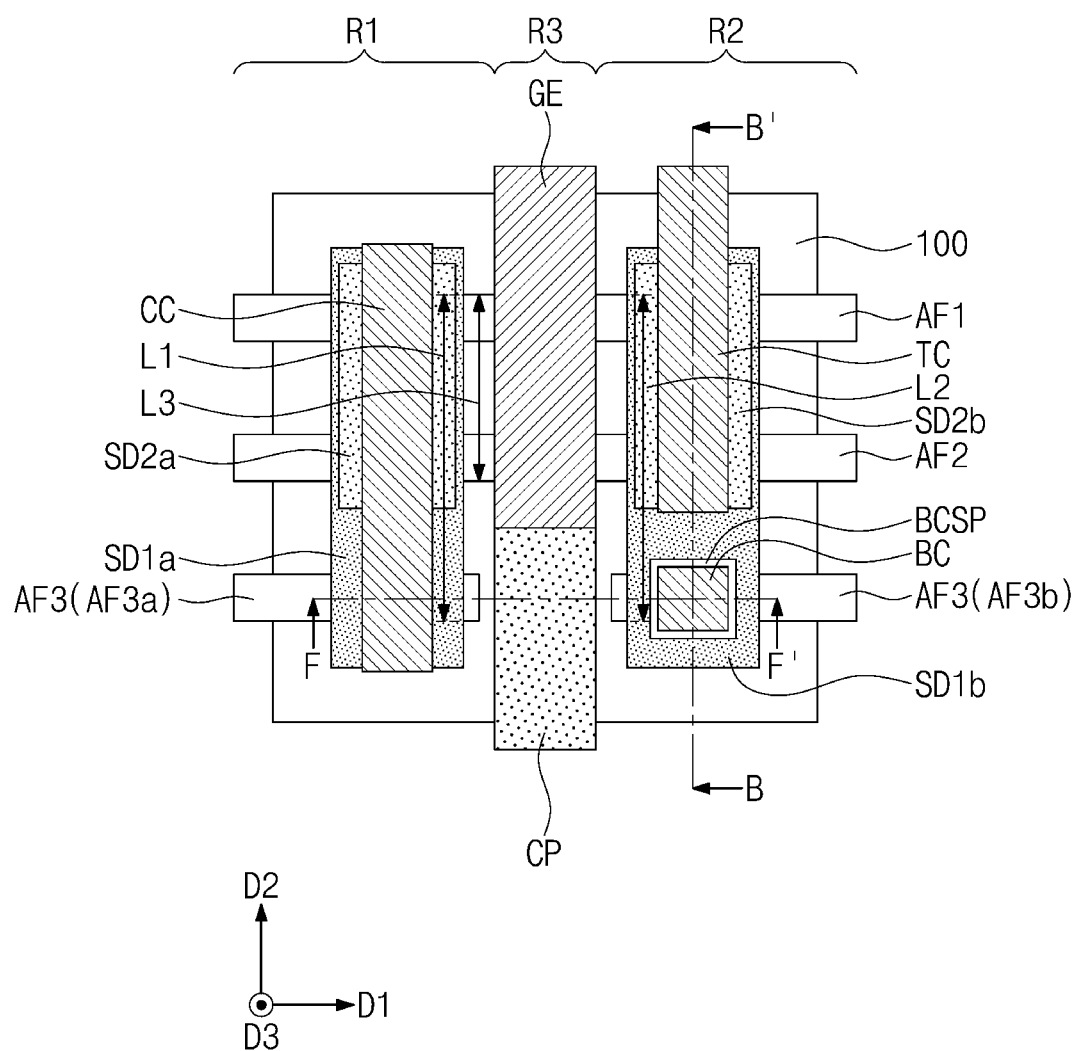
FIG. 6A is a plan view illustrating a semiconductor device according to some example embodiments.
Figure 6B:
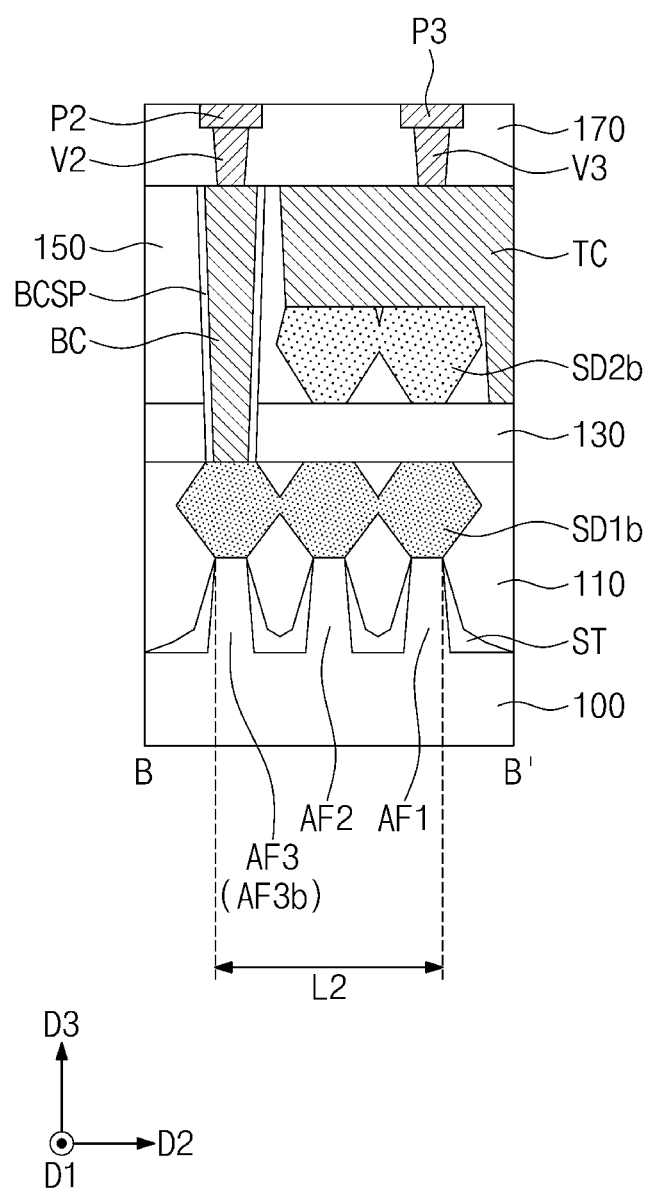
FIGS. 6B and 6C are cross-sectional views taken along lines B-B' and F-F' of FIG. 6A, respectively, to illustrate a semiconductor device according to some example embodiments.
Figure 6C:
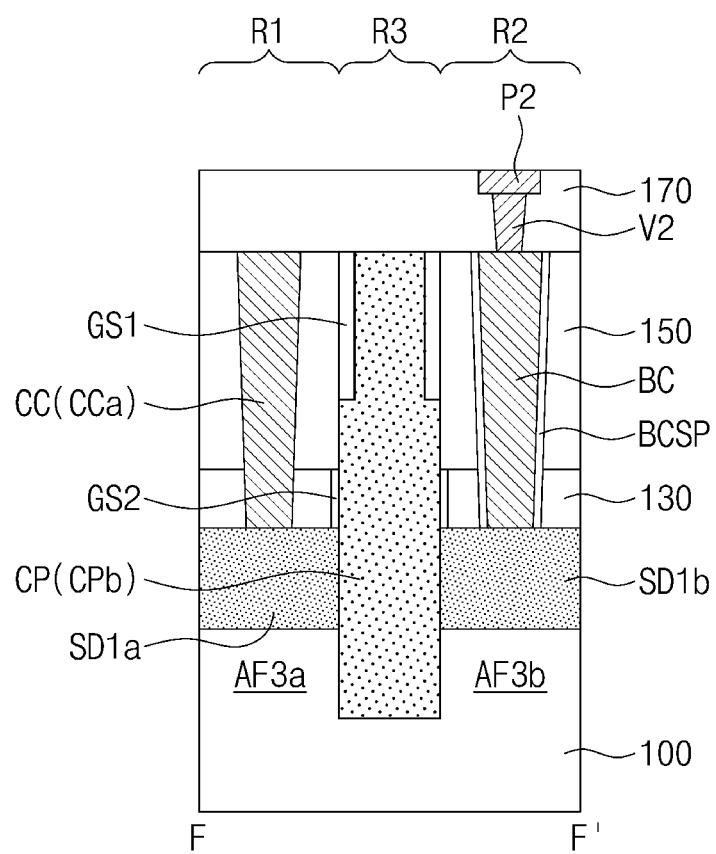

FIG. 6A is a plan view illustrating a semiconductor device according to some example embodiments. FIGS. 6B and 6C are cross-sectional views taken along lines B-B' and F-F' of FIG. 6A, respectively, to illustrate a semiconductor device according to some example embodiments. Hereinafter, for the purpose of ease and convenience in explanation, the descriptions to the same technical features as in the above-described embodiments will be omitted, and differences between the above-described example embodiments will be mainly described.

Referring to FIGS. 6A, 6B and 6C, an active pattern AP may include a plurality of active fins defined by the device isolation layer ST. More particularly, the active pattern AP may include first to third active fins AF1, AF2 and AF3 defined by the device isolation layer ST. The third active fin AF3 may include a first portion AF3a and a second portion AF3b which are spaced apart from each other in the first direction D1 with the capping pattern CP interposed therebetween.

The bottom contact BC may be provided on the second portion AF3b of the third active fin AF3. As shown in FIG. 6A, the bottom contact BC may overlap with the common contact CC in the first direction D1. The bottom contact BC may be spaced apart from the common contact CC in the first direction D1 with the capping pattern CP interposed therebetween.

A bottom contact spacer BCSP surrounding a side surface of the bottom contact BC may be provided. The bottom contact BC may be spaced apart from the top contact TC in the second direction D2 with the bottom contact spacer BCSP interposed therebetween. For example, the bottom contact spacer BCSP may include at least one of silicon oxide, silicon nitride, or silicon oxynitride. Because the bottom contact spacer BCSP surrounding the side surface of the bottom contact BC is provided, the use of a space may be improved, and an integration density of the semiconductor device may be improved.

Figure 7A:
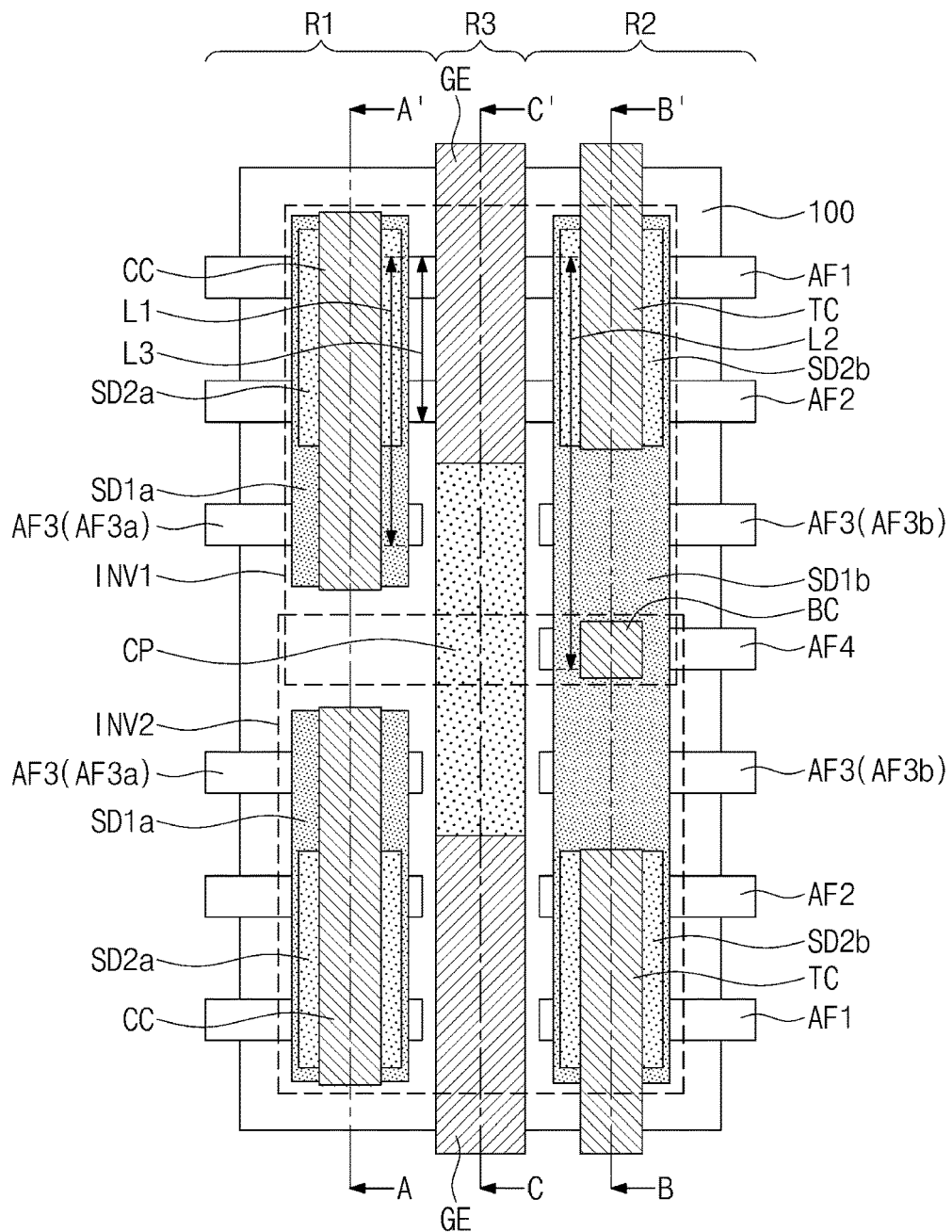
FIG. 7A is a plan view illustrating a semiconductor device according to some example embodiments.
Figure 7B:
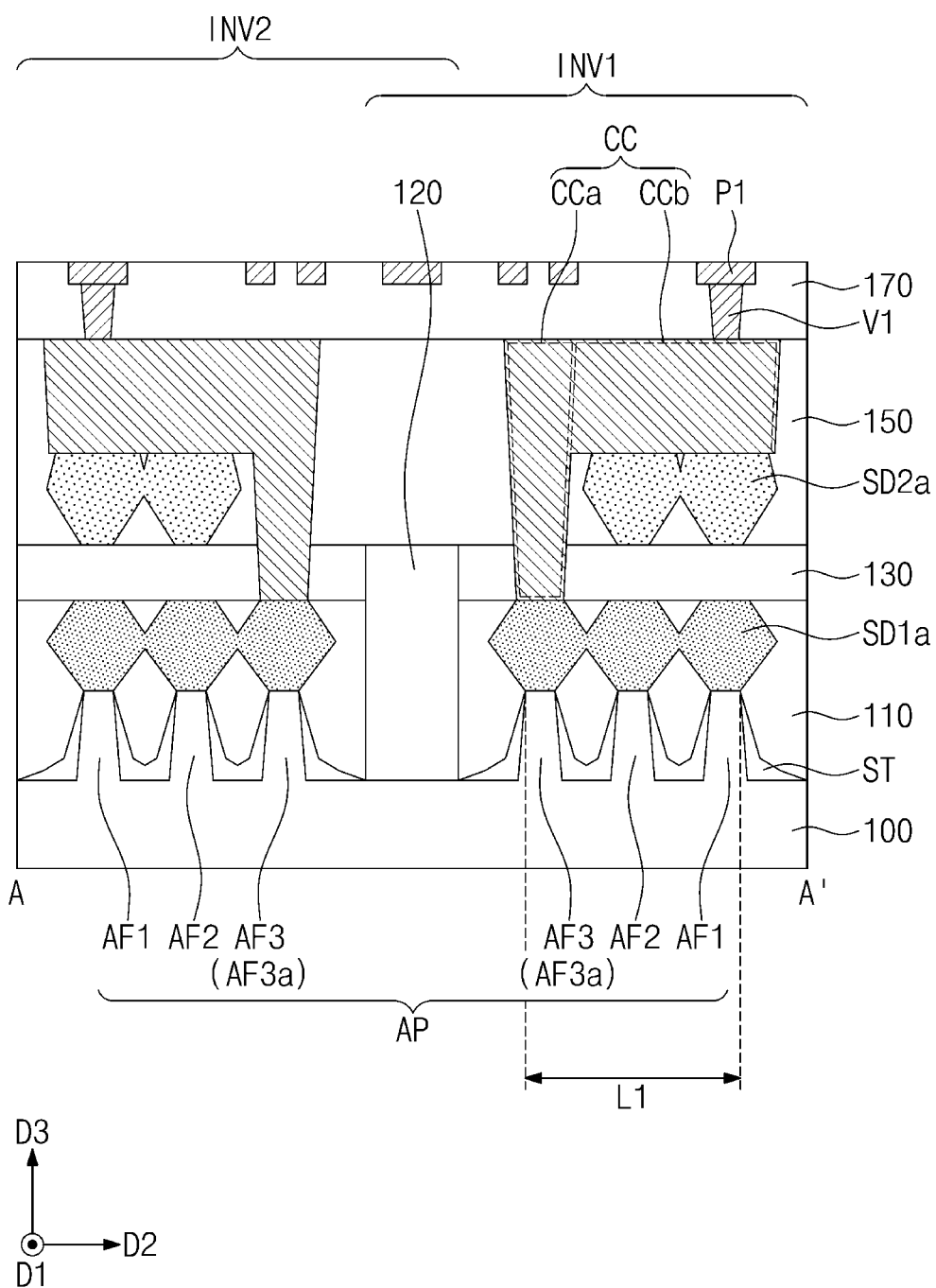
FIGS. 7B, 7C and 7D are cross-sectional views taken along lines A-A', B-B' and C-C' of FIG. 7A, respectively, to illustrate a semiconductor device according to some example embodiments.
Figure 7C:
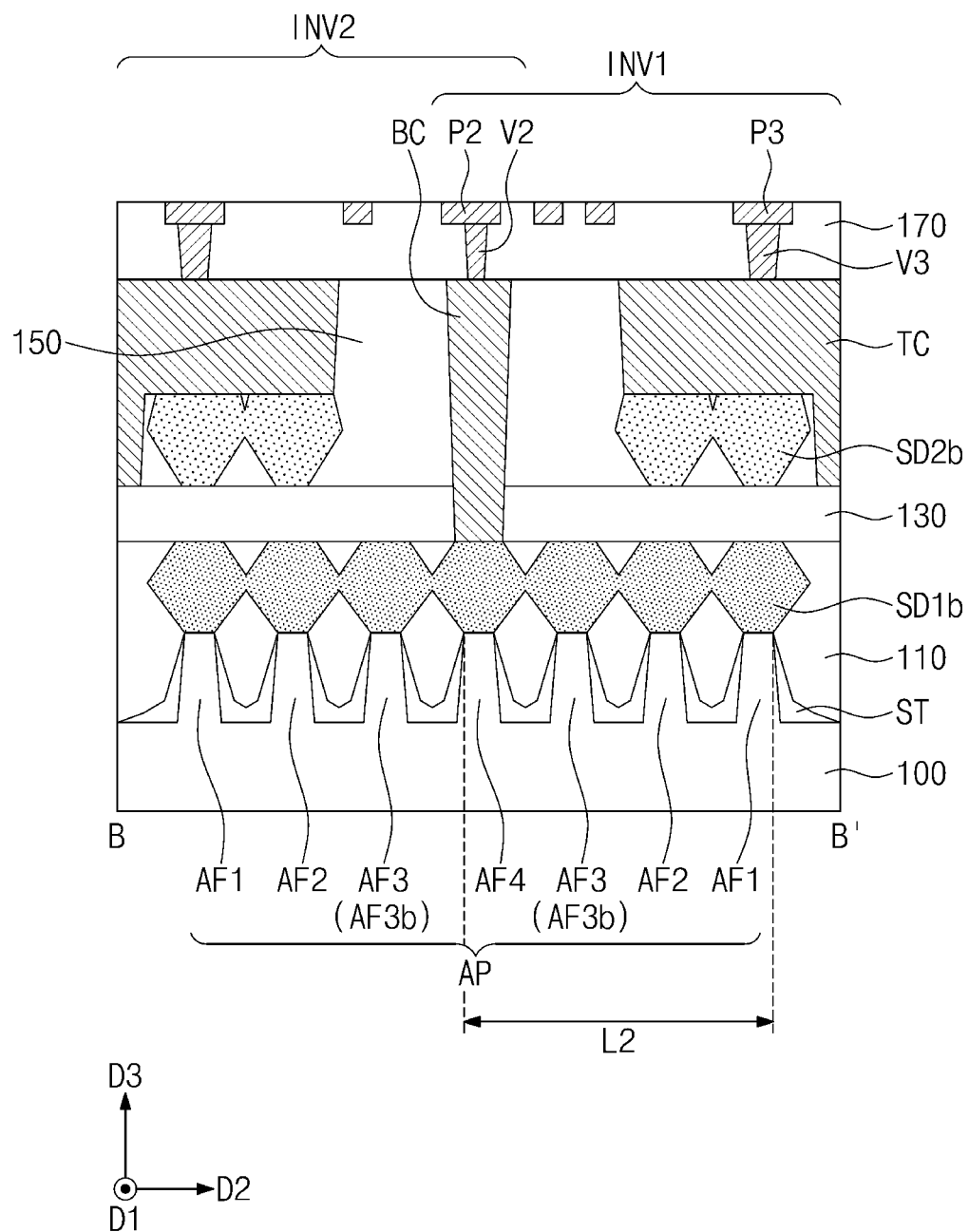
Figure 7D:
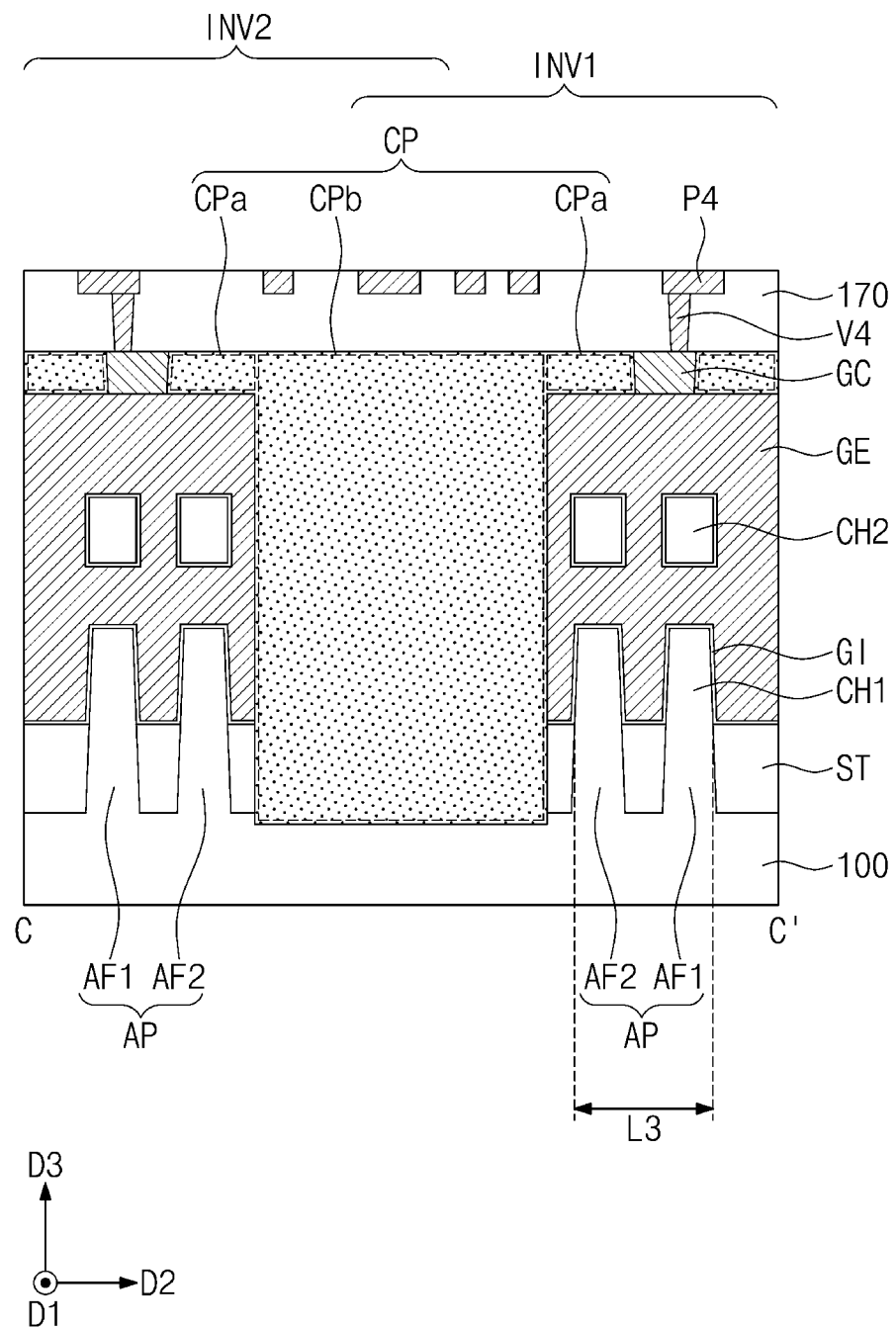

FIG. 7A is a plan view illustrating a semiconductor device according to some example embodiments. FIGS. 7B, 7C and 7D are cross-sectional views taken along lines A-A', B-B' and C-C' of FIG. 7A, respectively, to illustrate a semiconductor device according to some example embodiments. Hereinafter, for the purpose of ease and convenience in explanation, the descriptions to the same technical features as in the above-described example embodiments will be omitted, and differences between the above-described example embodiments will be mainly described.

Referring to FIGS. 7A, 7B, 7C and 7D, a semiconductor device according to some example embodiments may include, for example, a first inverter INV1 and a second inverter INV2. Hereinafter, the first inverter INV1 and the second inverter INV2 will be described. However, example embodiments are not limited thereto. The semiconductor device according to certain example embodiments may include various logic circuits (e.g., an AND circuit, an OR circuit, a NAND circuit, a NOR circuit, a flip-flop circuit, and/or a latch circuit), as well as the inverter.

Each of the first and second inverters INV1 and INV2 may have substantially the same structure as the semiconductor device described with reference to FIGS. 2A to 2E. The components of the first inverter INV1 and the components of the second inverter INV2 may face each other in the second direction D2 and may be disposed symmetrically. The first inverter INV1 and the second inverter INV2 may share a single fourth active fin AF4 and a single bottom contact BC. The components of the first inverter INV1 and the components of the second inverter INV2 may be symmetrical with respect to the single bottom contact BC. The single bottom contact BC may be provided on the single fourth active fin AF4. The single bottom contact BC may function as the bottom contact BC in each of the first and second inverters INV1 and INV2. Because the first inverter INV1 and the second inverter INV2 share the single bottom contact BC, the use of a space may be improved, and an integration density of the semiconductor device may be improved.

Figure 8A:
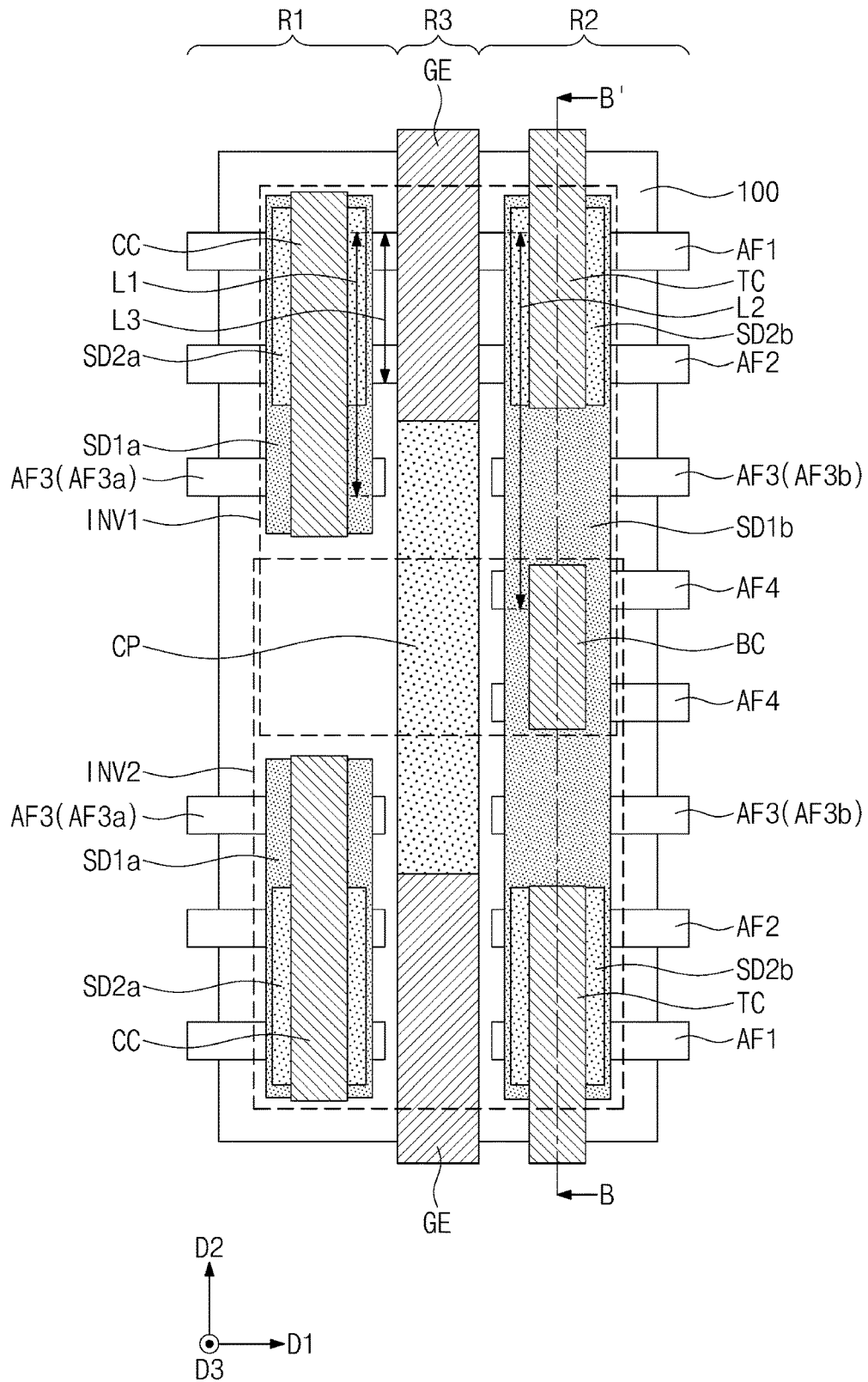
FIG. 8A is a plan view illustrating a semiconductor device according to some example embodiments.
Figure 8B:
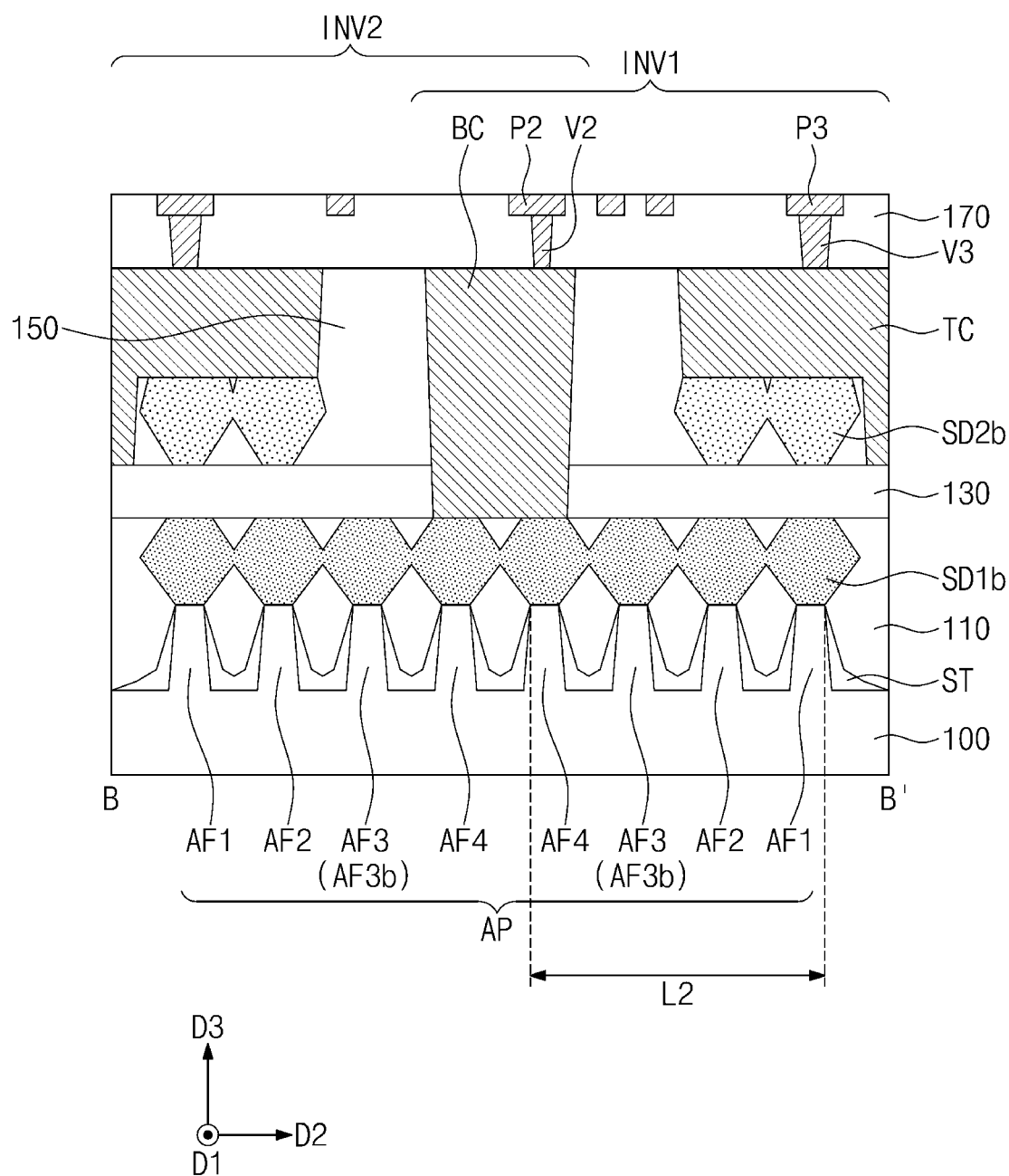
FIG. 8B is a cross-sectional view taken along a line B-B' of FIG. 8A to illustrate a semiconductor device according to some example embodiments.

FIG. 8A is a plan view illustrating a semiconductor device according to some example embodiments. FIG. 8B is a cross-sectional view taken along a line B-B' of FIG. 8A to illustrate a semiconductor device according to some example embodiments. Hereinafter, for the purpose of ease and convenience in explanation, the descriptions to the same technical features as in the above-described example embodiments will be omitted, and differences between the above-described example embodiments will be mainly described.

Referring to FIGS. 8A and 8B, a first inverter INV1 and a second inverter INV2 may share two fourth active fins AF4 and a single bottom contact BC. The single bottom contact BC may overlap with the two fourth active fins AF4 in the third direction D3. The single bottom contact BC may function as the bottom contact BC in each of the first and second inverters INV1 and INV2.

FIGS. 9A, 12A, 13A, 14A, 15A, 16A and 17A are plan views illustrating a method of manufacturing a semiconductor device according to some example embodiments. FIGS. 9B, 10, 11, 12B, 13B, 14B, 15B and 16B are cross-sectional views taken along lines E-E' of FIGS. 9A, 12A, 13A, 14A, 15A and 16A to illustrate a method of manufacturing a semiconductor device according to some example embodiments. FIGS. 12C, 13C and 14C are cross-sectional views taken along lines A-A' of FIGS. 12A, 13A and 14A, respectively, to illustrate a method of manufacturing a semiconductor device according to some example embodiments. FIGS. 13D and 14D are cross-sectional views taken along lines B-B' of FIGS. 13A and 14A, respectively, to illustrate a method of manufacturing a semiconductor device according to some example embodiments. FIGS. 16C and 17B are cross-sectional views taken along lines C-C' of FIGS. 16A and 17A, respectively, to illustrate a method of manufacturing a semiconductor device according to some example embodiments.

A method of manufacturing a semiconductor device according to some example embodiments will be described hereinafter in detail with reference to FIGS. 9A to 17B.

Figure 9A:
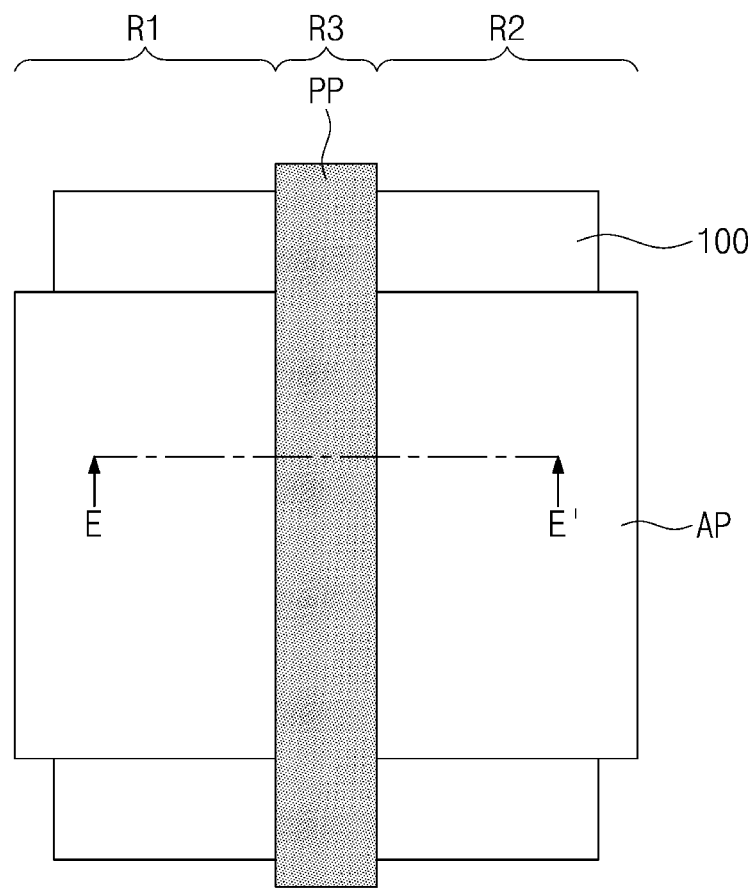
FIGS. 9A, 12A, 13A, 14A, 15A, 16A and 17A are plan views illustrating a method of manufacturing a semiconductor device according to some example embodiments.
Figure 9A:
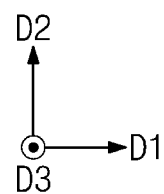
Figure 9B:
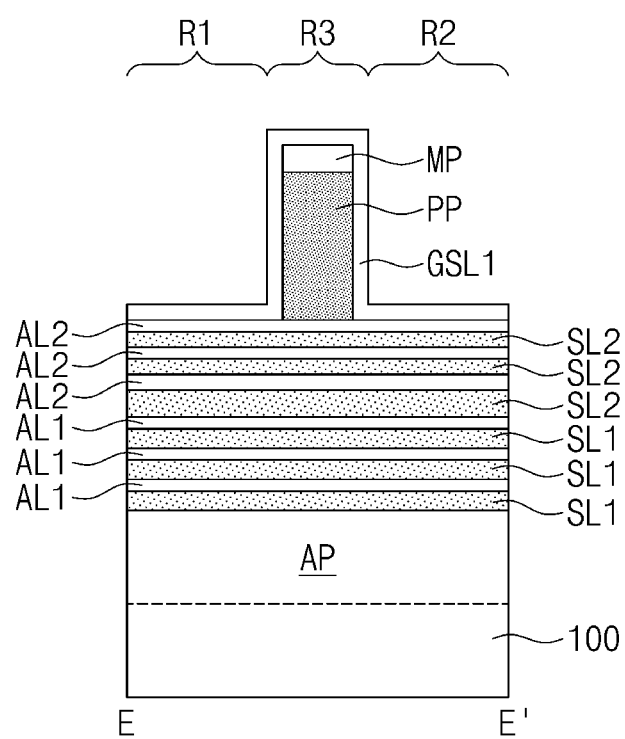
FIGS. 9B, 10, 11, 12B, 13B, 14B, 15B and 16B are cross-sectional views taken along lines E-E' of FIGS. 9A, 12A, 13A, 14A, 15A and 16A to illustrate a method of manufacturing a semiconductor device according to some example embodiments.

Referring to FIGS. 9A and 9B, first sacrificial layers SL1 and first active layers AL1 may be alternately and repeatedly stacked on a substrate 100. Second sacrificial layers SL2 and second active layers AL2 may be alternately and repeatedly stacked on a topmost one of the first active layers AL1.

The first and second sacrificial layers SL1 and SL2 may include a material having an etch selectivity with respect to the first and second active layers AL1 and AL2. For example, the first and second sacrificial layers SL1 and SL2 may be formed of silicon-germanium (SiGe), and the first and second active layers AL1 and AL2 may be formed of silicon (Si). Each of the first and second sacrificial layers SL1 and SL2 and the first and second active layers AL1 and AL2 may be formed using an epitaxial growth process.

The first and second sacrificial layers SL1 and SL2, the first and second active layers AL1 and AL2, and an upper portion of the substrate 100 may be patterned. A trench defining an active pattern AP may be formed in the substrate 100. A device isolation layer ST (see FIGS. 1B, 1C and 1D) may be formed in the trench.

A gate sacrificial pattern PP intersecting the active pattern AP in the second direction D2 may be formed on the active pattern AP. The gate sacrificial pattern PP may be formed to have a line shape or bar shape extending in the second direction D2. The formation of the gate sacrificial pattern PP may include depositing a gate sacrificial layer on a top surface of a topmost one of the second active layers AL2, forming a hard mask pattern MP on the gate sacrificial layer, and patterning the gate sacrificial layer using the hard mask pattern MP as an etch mask. The gate sacrificial pattern PP may be formed of, for example, poly-silicon.

A first gate spacer layer GSL1 may be formed to cover a top surface and both side surfaces of the gate sacrificial pattern PP. The first gate spacer layer GSL1 may extend onto the top surface of the topmost one of the second active layers AL2. The first gate spacer layer GSL1 may be formed of, for example, silicon nitride.

Figure 10:
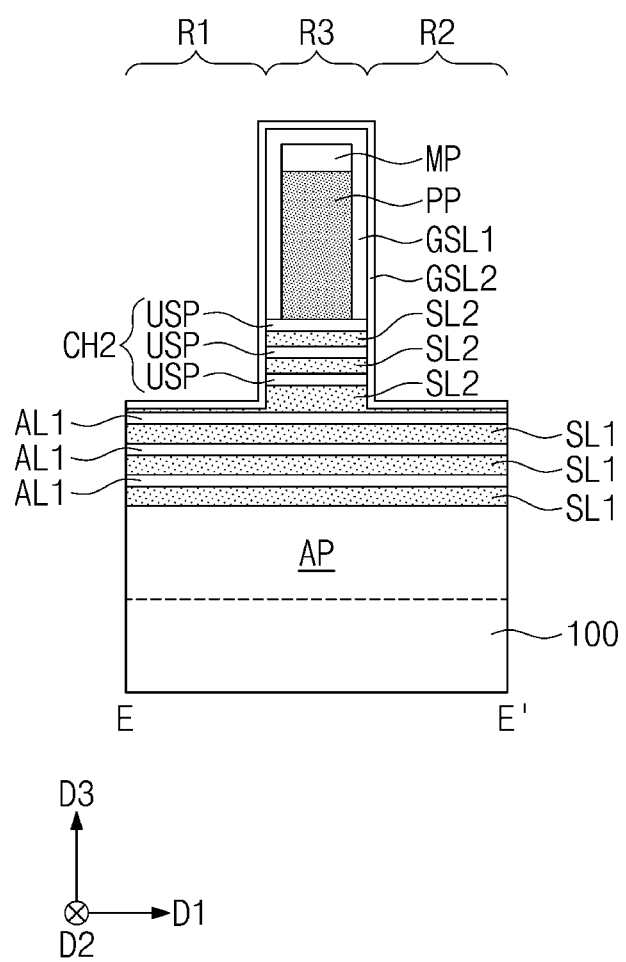

Referring to FIGS. 9B and 10, a portion of the first gate spacer layer GSL1 may be removed by a first etching process. By this first etching process, the first gate spacer layer GSL1 may be removed from the top surface of the topmost one of the second active layers AL2. By the first etching process, the first gate spacer layer GSL1 may remain on a top surface and side surfaces of the hard mask pattern MP, and side surfaces of the gate sacrificial pattern PP. The first etching process may be an anisotropic etching process.

Thereafter, a first patterning process may be performed on the second sacrificial layers SL2 and the second active layers AL2. The first patterning process may use the gate sacrificial pattern PP and the first gate spacer layer GSL1 as etch masks. A second channel pattern CH2 including upper semiconductor patterns USP may be formed by the first patterning process. In some example embodiments, after the first patterning process, a lower portion of a bottommost one of the second sacrificial layers SL2 may remain on the topmost one of the first active layers AL1.

A second gate spacer layer GSL2 may be formed to cover a top surface and side surfaces of the first gate spacer layer GSL1, side surfaces of the upper semiconductor patterns USP, and side surfaces of the second sacrificial layers SL2. The second gate spacer layer GSL2 may extend onto a top surface of the bottommost second sacrificial layer SL2 remaining on the topmost one of the first active layers AL1. The second gate spacer layer GSL2 may include, for example, silicon nitride.

Figure 11:
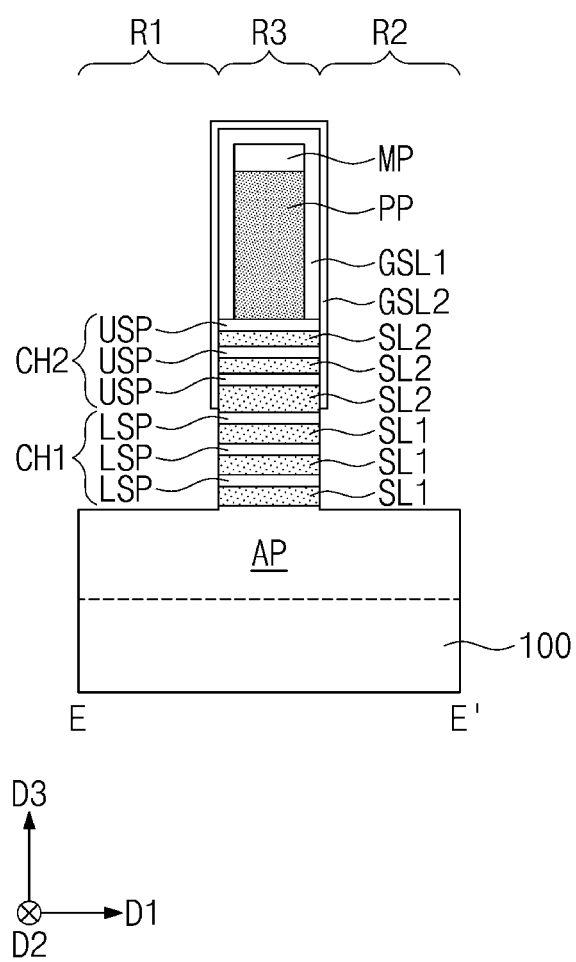

Referring to FIGS. 10 and 11, a portion of the second gate spacer layer GSL2 may be removed by a second etching process. By the second etching process, the second gate spacer layer GSL2 may be removed from the top surface of the bottommost second sacrificial layer SL2 remaining on the topmost one of the first active layers AL1. By the second etching process, the second gate spacer layer GSL2 may remain on the top surface and the side surfaces of the first gate spacer layer GSL1, the side surfaces of the upper semiconductor patterns USP, and the side surfaces of the second sacrificial layers SL2. The second etching process may be an anisotropic etching process.

Thereafter, a second patterning process may be performed on the first sacrificial layers SL1 and the first active layers AL1. The second patterning process may use the gate sacrificial pattern PP, the first gate spacer layer GSL1 and the second gate spacer layer GSL2 as etch masks. A first channel pattern CH1 including lower semiconductor patterns LSP may be formed by the second patterning process. In some example embodiments, a portion of the substrate 100 may also be removed by the second patterning process.

Figure 12A:
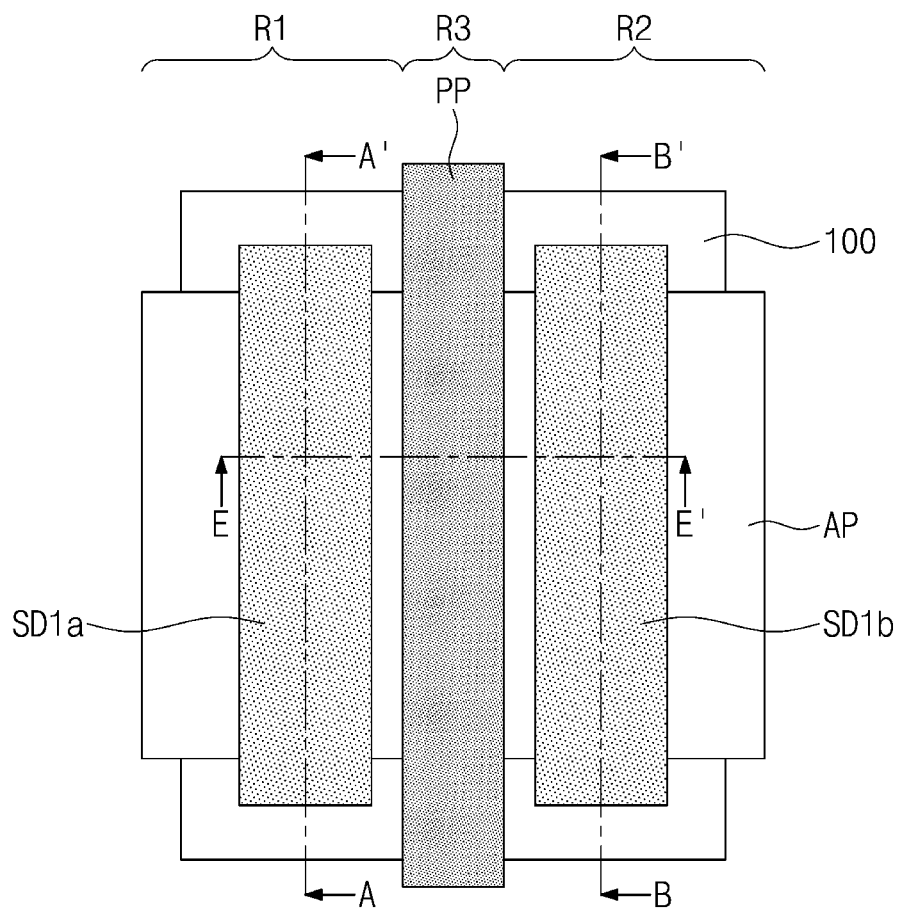
Figure 12B:
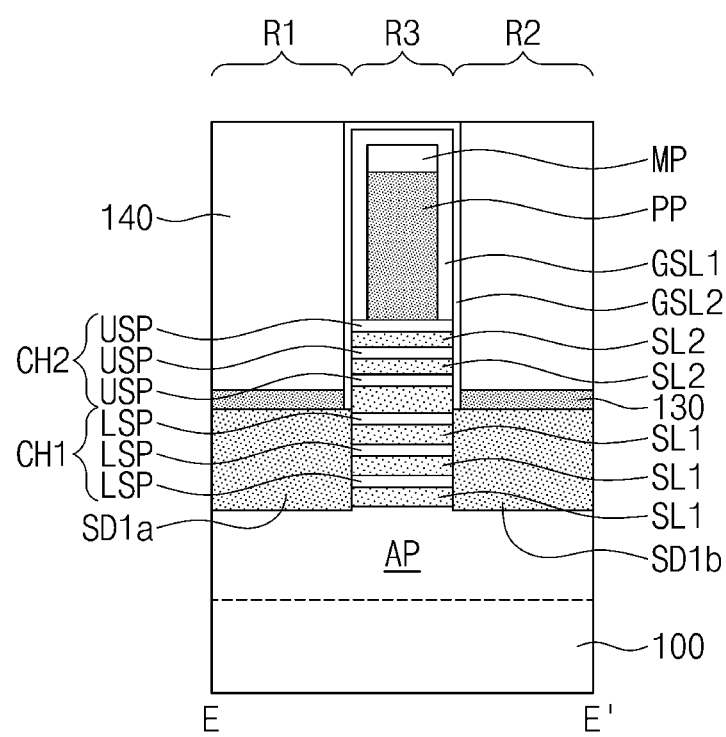
Figure 12C:
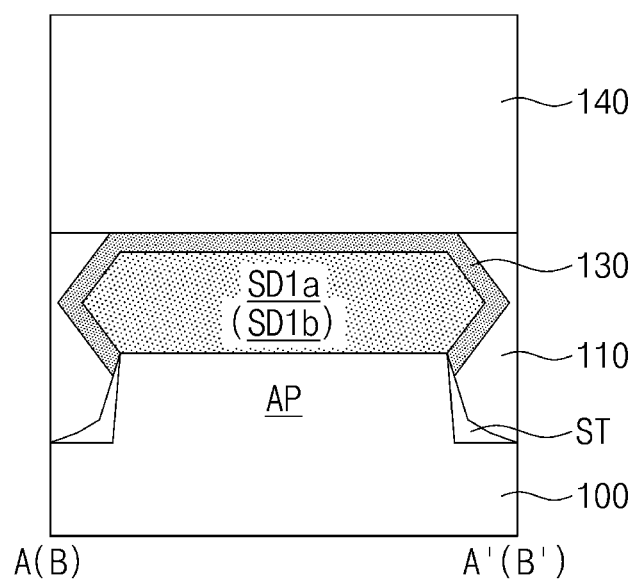
FIGS. 12C, 13C and 14C are cross-sectional views taken along lines A-A' of FIGS. 12A, 13A and 14A, respectively, to illustrate a method of manufacturing a semiconductor device according to some example embodiments.
Figure 13A:
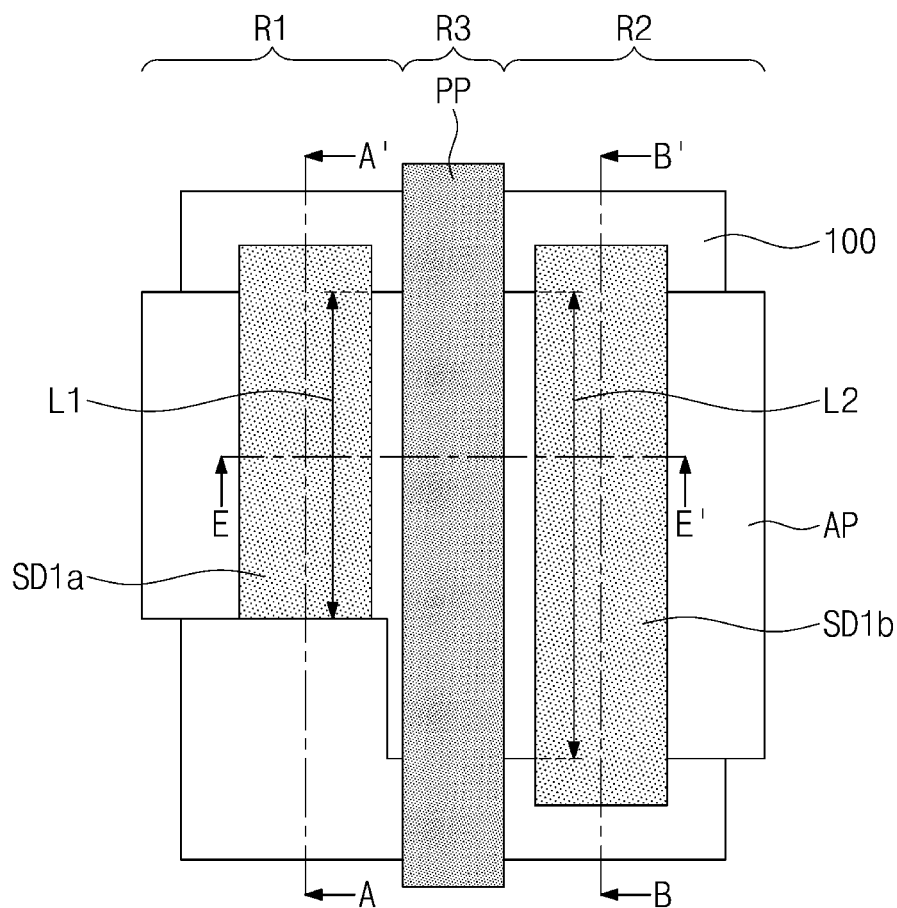
Figure 13B:
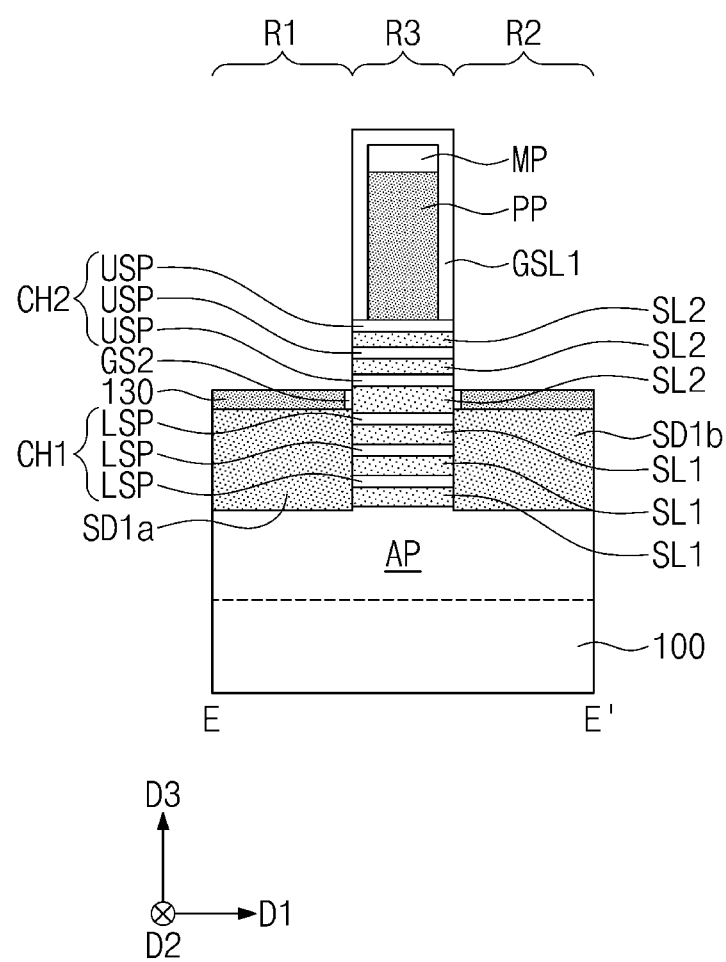
Figure 13C:
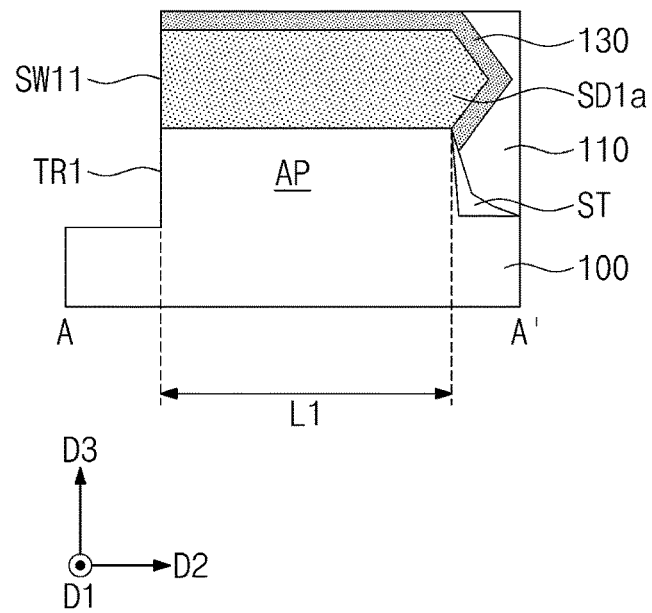
Figure 13D:
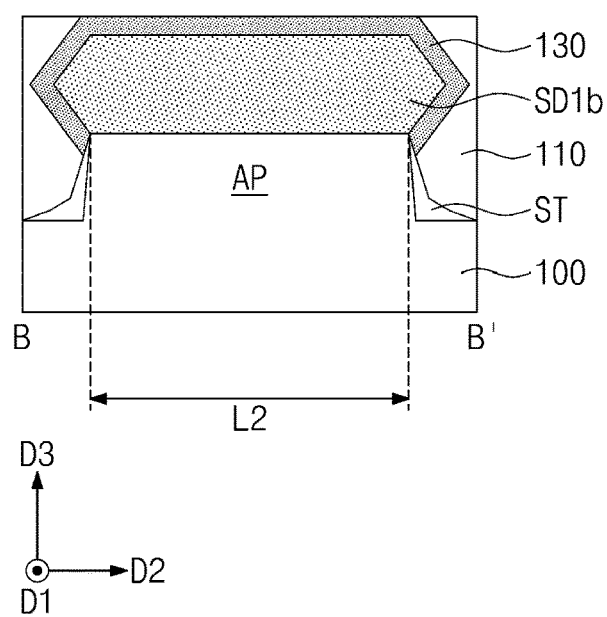
FIGS. 13D and 14D are cross-sectional views taken along lines B-B' of FIGS. 13A and 14A, respectively, to illustrate a method of manufacturing a semiconductor device according to some example embodiments.

Referring to FIGS. 12A, 12B and 12C, first and second lower source/drain patterns SD1a and SD1b extending in the second direction D2 may be formed on the active pattern AP. The first and second lower source/drain patterns SD1a and SD1b may be formed by an epitaxial growth process using the substrate 100 and the lower semiconductor patterns LSP as a seed. The first lower source/drain pattern SD1a may be formed on the first region R1, and the second lower source/drain pattern SD1b may be formed on the second region R2. The first and second lower source/drain patterns SD1a and SD1b may be formed at both sides of the gate sacrificial pattern PP, respectively. Each of the first and second lower source/drain patterns SD1a and SD1b may be in contact with side surfaces of the lower semiconductor patterns LSP of the first channel pattern CH1, side surfaces of the first sacrificial layers SL1 and a bottommost surface of the second gate spacer layer GSL2.

A first insulating layer 110 covering side surfaces of the first and second lower source/drain patterns SD1a and SD1b, and a top surface of the device isolation layer ST may be formed, and a third insulating layer 130 covering top surfaces of the first and second lower source/drain patterns SD1a and SD1b may be formed. A sacrificial insulating layer 140 may be formed on the third insulating layer 130. A top surface of the sacrificial insulating layer 140 may be substantially coplanar with a top surface of the second gate spacer layer GSL2. The sacrificial insulating layer 140 may be formed of a material having an etch selectivity with respect to the third insulating layer 130.

Referring to FIGS. 12B, 12C, 13A, 13B, 13C and 13D, a first trench TR1 penetrating the third insulating layer 130, the first lower source/drain pattern SD1a and the first insulating layer 110 may be formed on the first region R1. The first trench TR1 may expose a side surface of the third insulating layer 130, a first side surface SW11 of the first lower source/drain pattern SD1a, and a side surface of the active pattern AP. A bottom surface of the first trench TR1 may be located at a lower level than a bottom surface of the device isolation layer ST.

The sacrificial insulating layer 140 may be removed. A portion of the second gate spacer layer GSL2 may be removed together with the sacrificial insulating layer 140. At this time, other portions of the second gate spacer layer GSL2, which are in contact with side surfaces of the third insulating layer 130, may remain, and thus a pair of second gate spacers GS2 may be formed.

Referring to FIGS. 14A, 14B, 14C and 14D, a second insulating layer 120 filling the first trench TR1 may be formed. A top surface of the second insulating layer 120 may be substantially coplanar with a top surface of the third insulating layer 130.

First and second upper source/drain patterns SD2a and SD2b extending in the second direction D2 may be formed on the third insulating layer 130. The first and second upper source/drain patterns SD2a and SD2b may be formed by an epitaxial growth process using the upper semiconductor patterns USP as a seed. The first upper source/drain pattern SD2a may be formed on the first lower source/drain pattern SD1a (i.e., may be formed on the first region R1), and the second upper source/drain pattern SD2b may be formed on the second lower source/drain pattern SD1b (i.e., may be formed on the second region R2). The first and second upper source/drain patterns SD2a and SD2b may be formed at both sides of the gate sacrificial pattern PP, respectively. Each of the first and second upper source/drain patterns SD2a and SD2b may be in contact with a side surface of the first gate spacer layer GSL1, side surfaces of the upper semiconductor patterns USP of the second channel pattern CH2, side surfaces of the second sacrificial layers SL2, and top surfaces of the second gate spacers GS2.

A fourth insulating layer 150 may be formed to cover side surfaces and top surfaces of the first and second upper source/drain patterns SD2a and SD2b, and top surfaces of the second and third insulating layers 120 and 130. A top surface of the fourth insulating layer 150 may be substantially coplanar with the top surface of the first gate spacer layer GSL1.

Figure 14A:
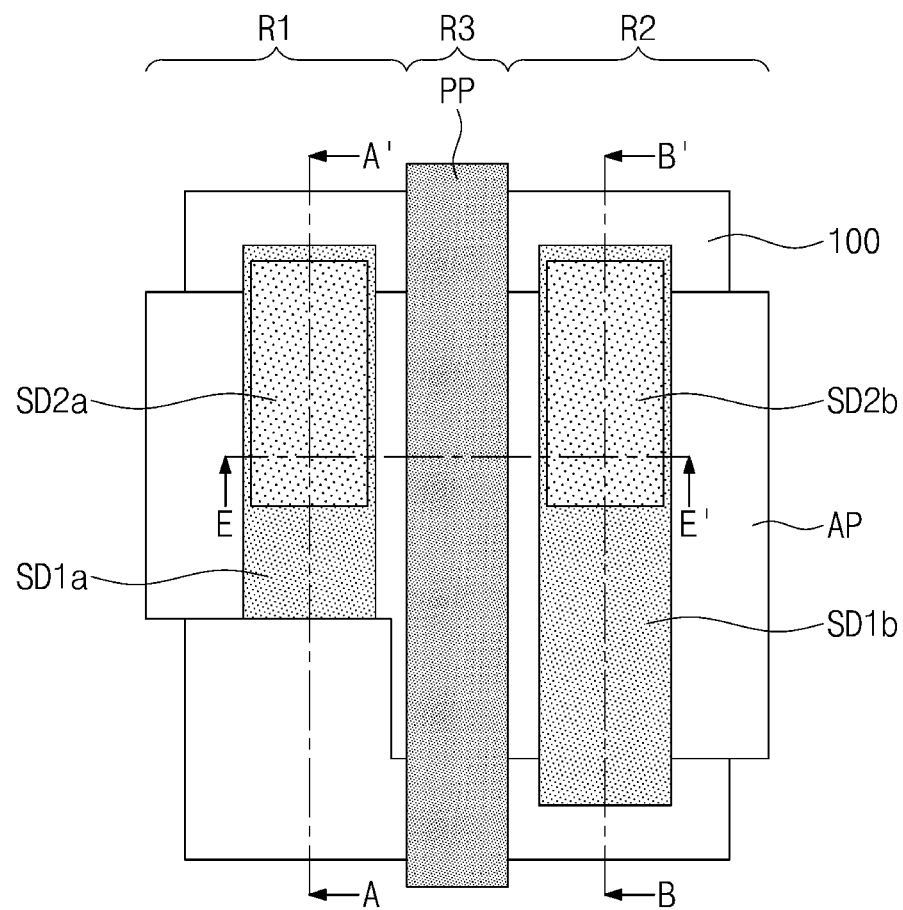
Figure 14B:
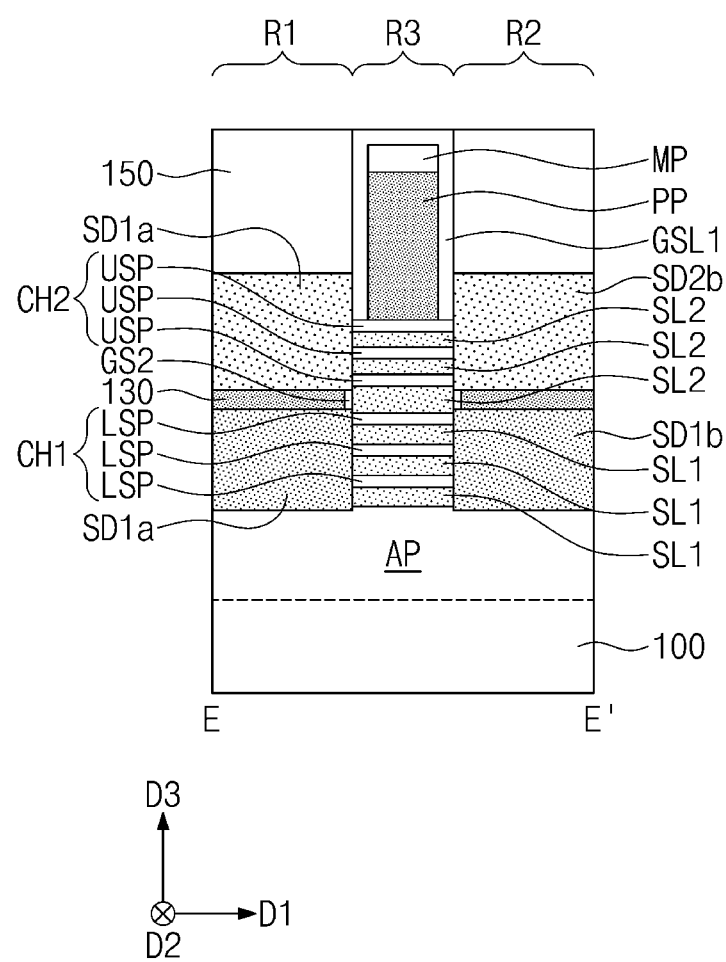
Figure 14C:
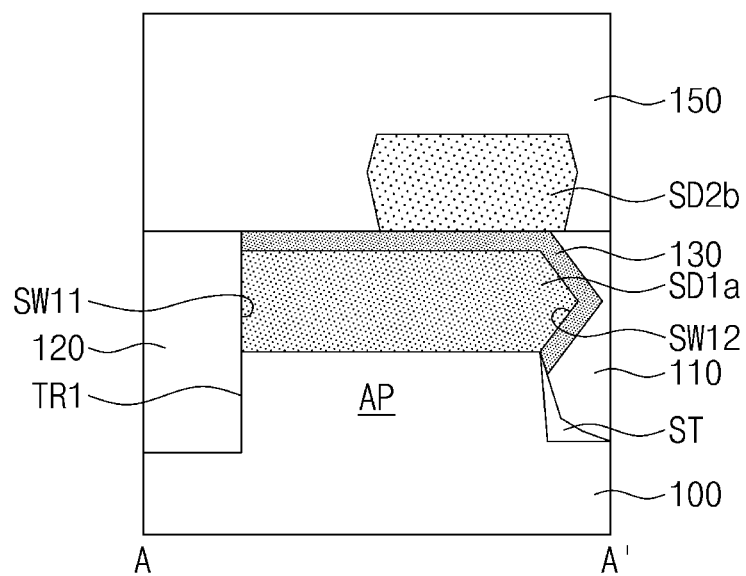
Figure 14C:
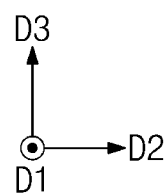
Figure 14D:
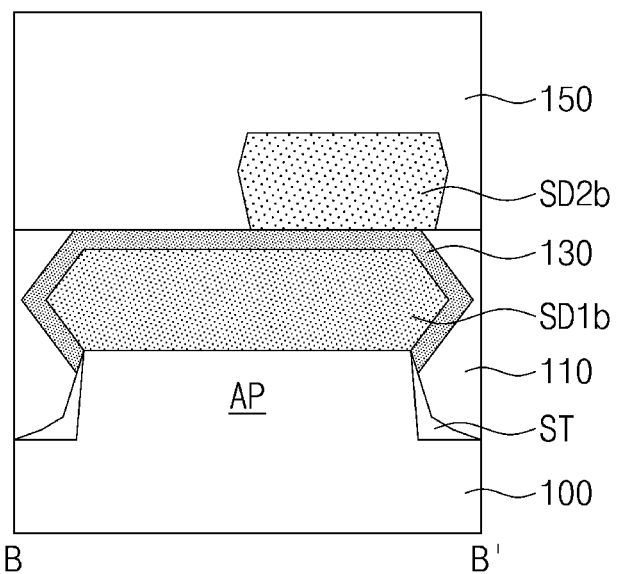
Figure 14D:
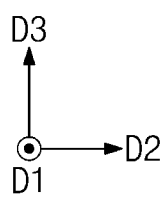
Figure 15A:
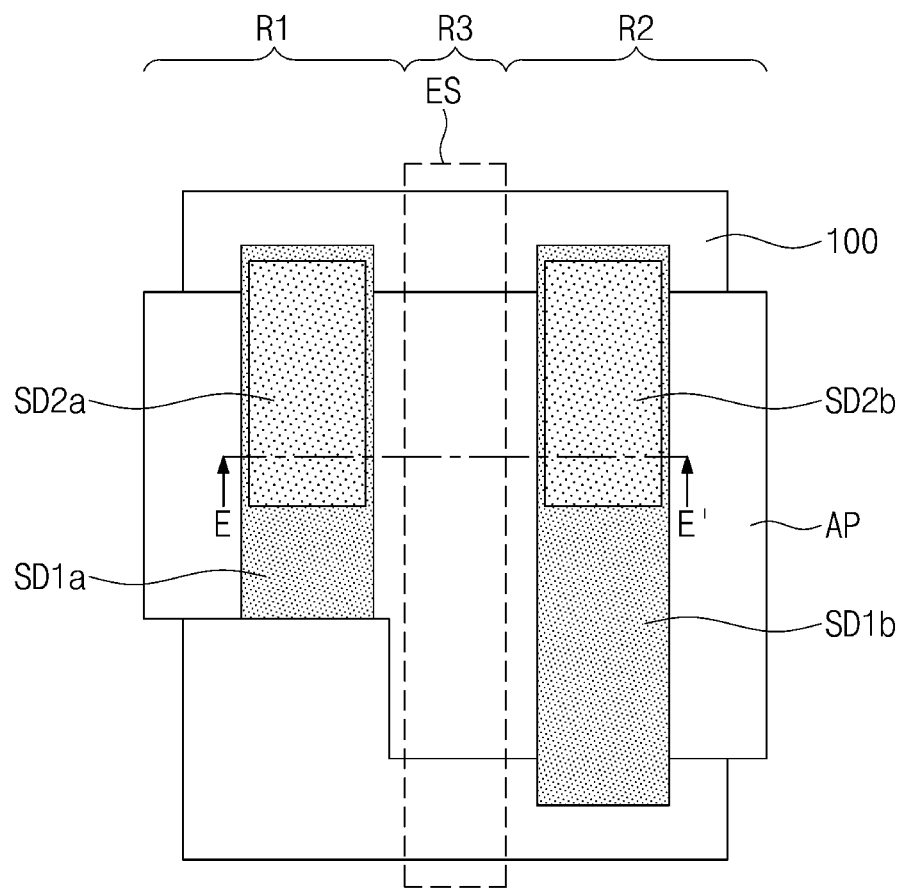
Figure 15B:
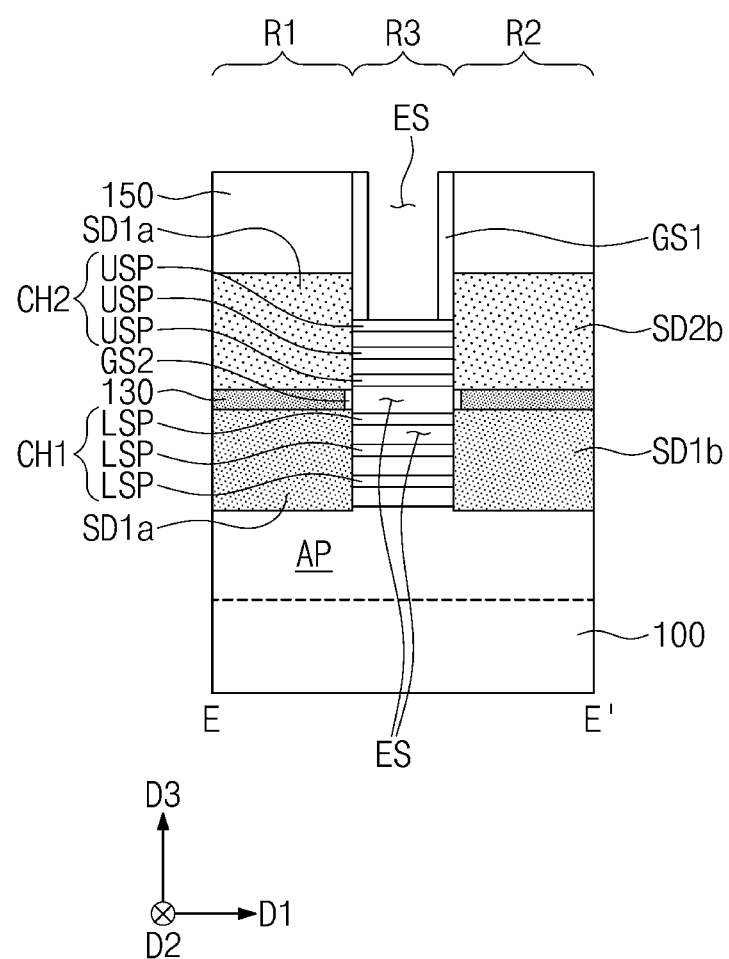
Figure 16A:
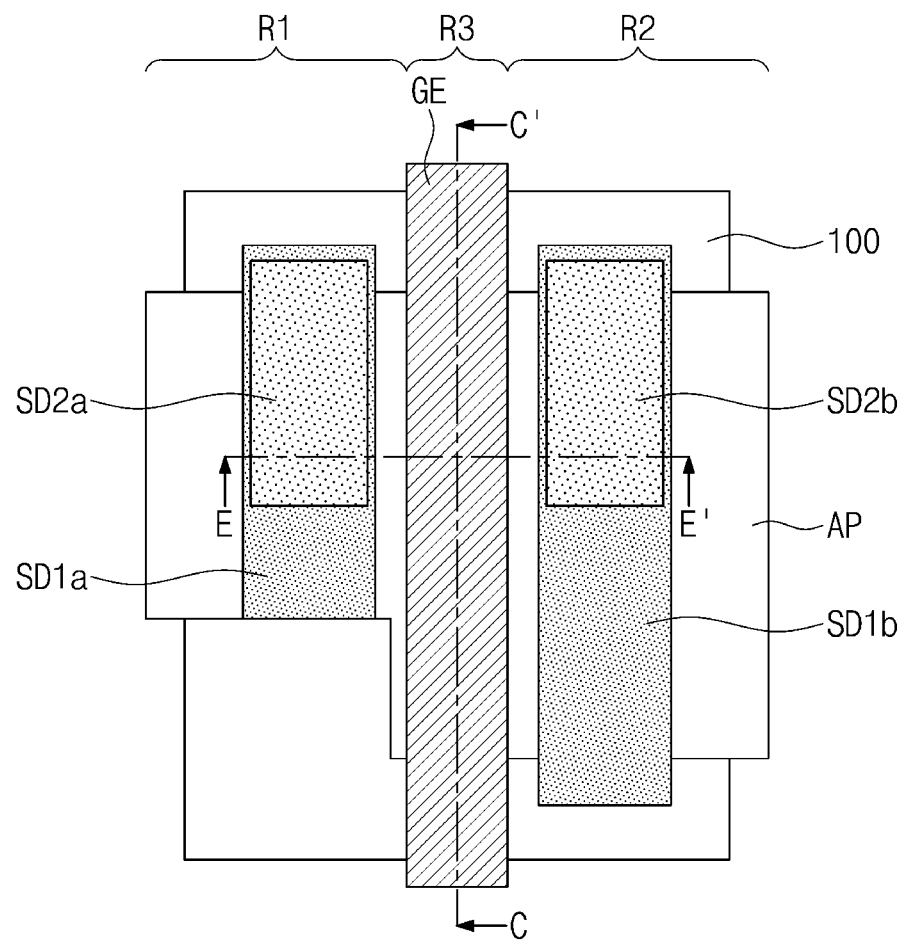
Figure 16B:
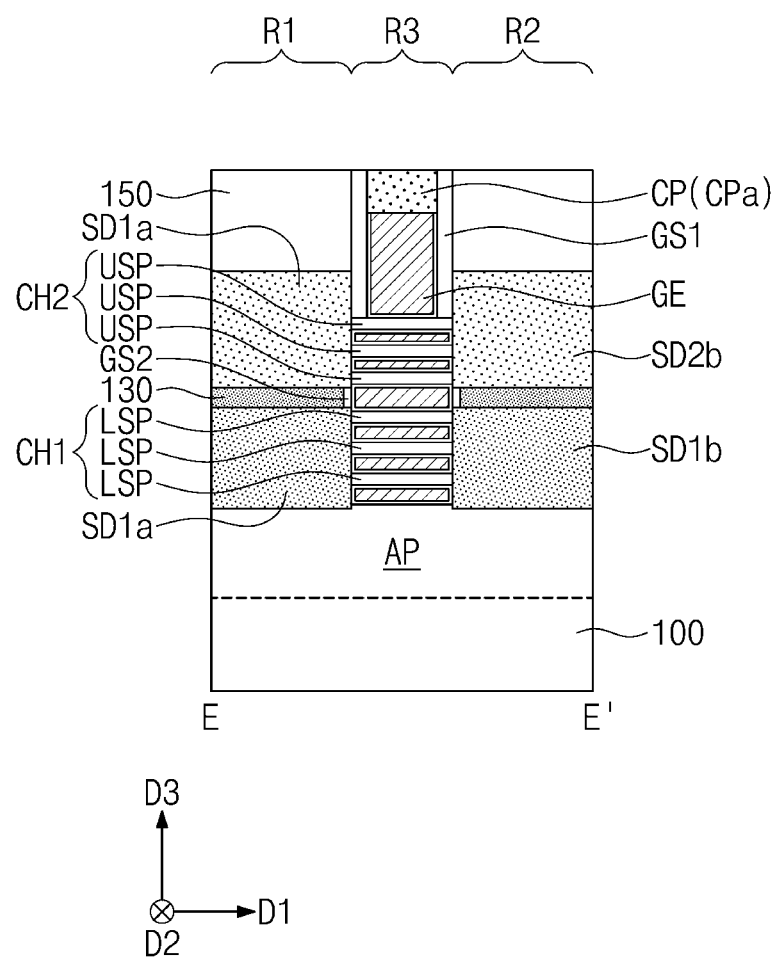
Figure 16C:
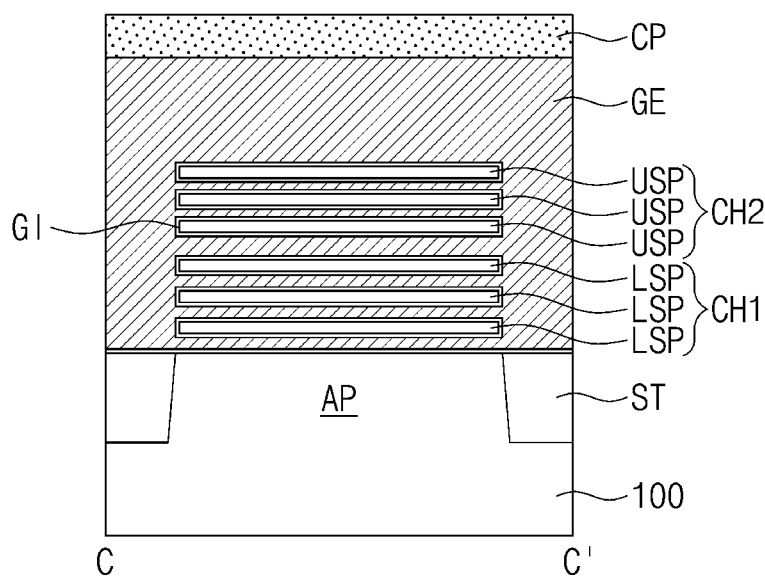
FIGS. 16C and 17B are cross-sectional views taken along lines C-C' of FIGS. 16A and 17A, respectively, to illustrate a method of manufacturing a semiconductor device according to some example embodiments.
Figure 16C:
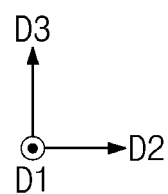

Referring to FIGS. 14B, 15A and 15B, an upper portion of the first gate spacer layer GSL1, the hard mask pattern MP and an upper portion of the fourth insulating layer 150 may be removed by a planarization process. For example, the planarization process may be an etch-back process or a chemical mechanical polishing (CMP) process. Because the upper portion of the first gate spacer layer GSL1 is removed by the planarization process, first gate spacers GS1 may be formed. By the planarization process, a top surface of the fourth insulating layer 150 may be substantially coplanar with top surfaces of the first gate spacers GS1.

Next, the gate sacrificial pattern PP and the first and second sacrificial layers SL1 and SL2, which are exposed to the outside, may be selectively removed by a third etching process. The third etching process may be a wet etching process. Empty spaces ES may be formed by the selective removal of the gate sacrificial pattern PP and the first and second sacrificial layers SL1 and SL2. Top and bottom surfaces of the lower semiconductor patterns LSP of the first channel pattern CH1 and top and bottom surfaces of the upper semiconductor patterns USP of the second channel pattern CH2 may be exposed by the empty spaces ES.

Referring to FIGS. 15A, 15B, 16A, 16B and 16C, a gate insulating pattern GI, a gate electrode GE and a capping pattern CP may be formed to fill the empty spaces ES. The gate electrode GE may extend in the second direction D2 on the third region R3, and a length of the gate electrode GE in the second direction D2 may be greater than a maximum length of the active pattern AP in the second direction D2.

The gate insulating pattern GI may be conformally formed between the gate electrode GE and the lower semiconductor patterns LSP, between the gate electrode GE and the upper semiconductor patterns USP, between the gate electrode GE and the first and second lower source/drain patterns SD1a and SD1b, between the gate electrode GE and the first and second upper source/drain patterns SD2a and SD2b and between the gate electrode GE and the first gate spacers GS1.

The capping pattern CP may be formed on a topmost surface of the gate electrode GE and may be in contact with side surfaces of the first gate spacers GS1. A top surface of the capping pattern CP may be substantially coplanar with the top surfaces of the first gate spacers GS1 and the top surface of the fourth insulating layer 150.

Figure 17A:
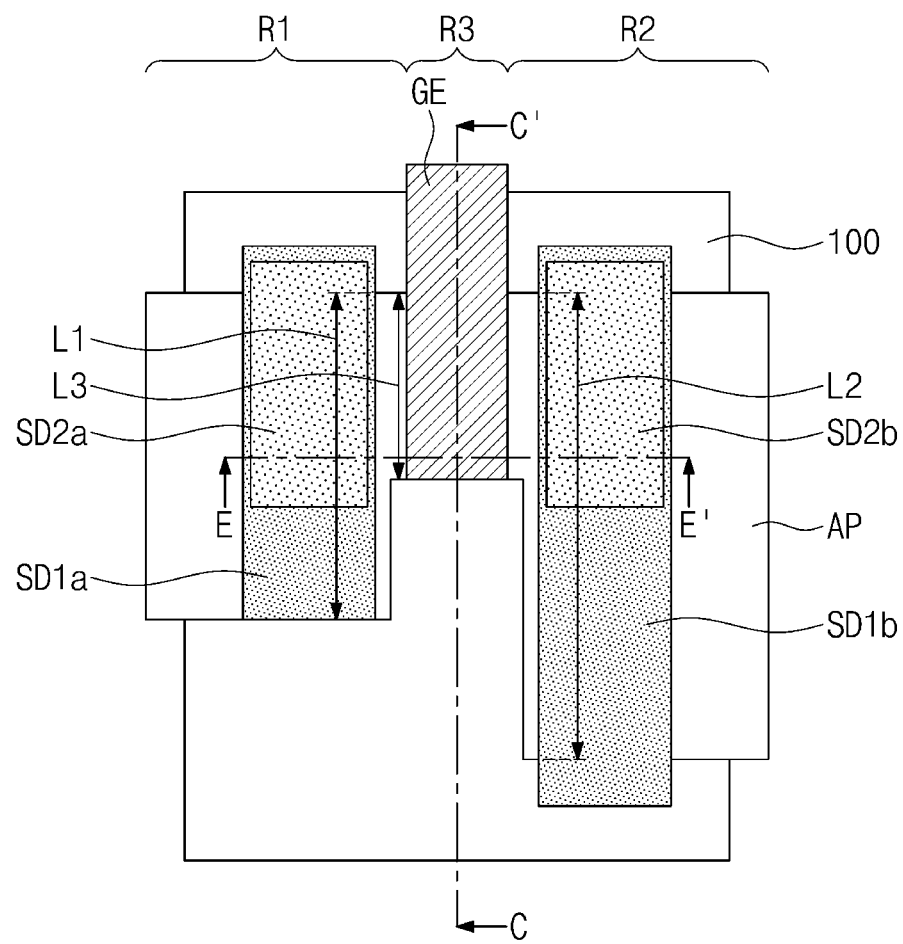
Figure 17B:
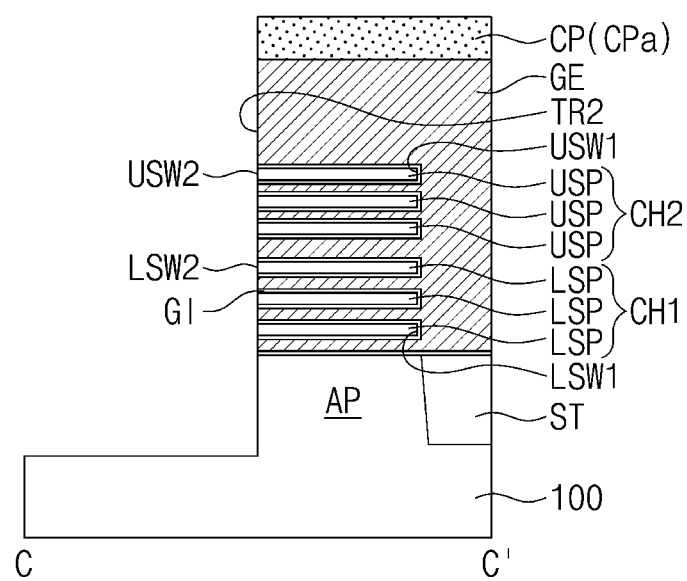
Figure 17B:
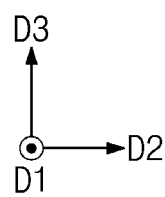

Referring to FIGS. 17A and 17B, a second trench TR2 penetrating the capping pattern CP, the gate electrode GE, the first and second channel patterns CH1 and CH2 and the active pattern AP may be formed on the third region R3. The second trench TR2 may expose second side surfaces LSW2 of the lower semiconductor patterns LSP of the first channel pattern CH1, second side surfaces USW2 of the upper semiconductor patterns USP of the second channel pattern CH2, and a side surface of the active pattern AP. A bottom surface of the second trench TR2 may be located at a lower level than the bottom surface of the device isolation layer ST.

Referring to FIGS. 1A, 1B, 1C, 1D, 1E, 1F, 17A and 17B, the capping pattern CP filling the second trench TR2 may be formed. More particularly, the capping pattern CP may include a first portion CPa formed previously on the gate electrode GE, and a second portion CPb filling the second trench TR2. A top surface of the first portion CPa of the capping pattern CP may be substantially coplanar with a top surface of the second portion CPb. The second portion CPb of the capping pattern CP may be in contact with a side surface of the gate electrode GE and may extend in the second direction D2 on the third region R3.

Thereafter, a common contact CC, a bottom contact BC, a top contact TC and a gate contact GC may be formed. The common contact CC may penetrate the third insulating layer 130 and the fourth insulating layer 150 on the first region R1 so as to be in contact with the first lower source/drain pattern SD1a and the first upper source/drain pattern SD2a. The bottom contact BC may penetrate the third insulating layer 130 and the fourth insulating layer 150 on the second region R2 so as to be in contact with a top surface of the second lower source/drain pattern SD1b. The top contact TC may penetrate the fourth insulating layer 150 so as to be in contact with a top surface of the second upper source/drain pattern SD2b. The gate contact GC may penetrate the first portion CPa of the capping pattern CP on the third region R3 so as to be in contact with the top surface of the gate electrode GE.

Thereafter, a fifth insulating layer 170 may be formed to cover the common contact CC, the bottom contact BC, the top contact TC and the gate contact GC, and first to fourth pads P1, P2, P3 and P4 and first to fourth vias V1, V2, V3 and V4 may be formed in the fifth insulating layer 170.

The semiconductor device according to example embodiments may include vertical contacts (i.e., the common contact, the bottom contact and the top contact) which are in contact with the top surfaces of the lower source/drain patterns and the upper source/drain patterns, and thus the process of forming contacts may be easily performed.

In addition, in the semiconductor device according to example embodiments, the lower source/drain patterns and the upper source/drain patterns may be epitaxial-grown in a direction perpendicular to the extending direction of the gate electrode, and the width (e.g., the width in the first direction) of each of the lower and upper source/drain patterns may be uniformly maintained. Thus, the epitaxial growth process may be easily performed, and a pitch of the gate electrodes formed repeatedly may be reduced. As a result, the integration density of the semiconductor device may be improved, and deterioration of electrical characteristics caused by non-uniformity of a structure may be minimized or prevented.

While aspects of example embodiments have been particularly shown and described, it will be understood by one of ordinary skill in the art that variations in form and detail may be made therein without departing from the spirit and scope of the attached claims.

What is claimed is:

1. A semiconductor device comprising:
 an active pattern extending in a first direction on a substrate;
 a first lower source/drain pattern provided on the active pattern;
 a second lower source/drain pattern provided on the active pattern and spaced apart from the first lower source/drain pattern in the first direction;
 a first upper source/drain pattern provided on the first lower source/drain pattern;
 a second upper source/drain pattern provided on the second lower source/drain pattern; and
 a gate electrode crossing the active pattern and extending in a second direction intersecting the first direction,
 wherein the gate electrode comprises an overlapping portion overlapping the active pattern in a third direction perpendicular to the first direction and the second direction, and
 wherein a length of the overlapping portion in the second direction is less than a length of the first lower source/drain pattern in the second direction.

2. The semiconductor device of claim 1, wherein the length of the first lower source/drain pattern in the second direction is less than a length of the second lower source/drain pattern in the second direction.

3. The semiconductor device of claim 1, wherein a length, in the second direction, of each of the first upper source/drain pattern and the second upper source/drain pattern is less than a length, in the second direction, of each of the first lower source/drain pattern and the second lower source/drain pattern.

4. The semiconductor device of claim 1, further comprising a capping pattern contacting a top surface and a side surface of the gate electrode, and extending in the second direction.

5. The semiconductor device of claim 4, wherein the capping pattern comprises:
 a first portion provided on the top surface of the gate electrode; and
 a second portion connected to the first portion, and provided on the side surface of the gate electrode and a top surface of the substrate, and
 wherein a bottom surface of the second portion of the capping pattern is closer to the top surface of the substrate than a top surface of the active pattern.

6. The semiconductor device of claim 5, wherein the second portion of the capping pattern overlaps at least a portion of each of the first lower source/drain pattern and the second lower source/drain pattern in the first direction.

7. The semiconductor device of claim 1, wherein the active pattern comprises a plurality of active fins extending in the first direction.

8. The semiconductor device of claim 7, further comprising:
 a capping pattern contacting a top surface and a side surface of the gate electrode, and extending in the second direction,
 wherein the plurality of active fins comprises a first active fin, a second active fin and a third active fin, and
 wherein the third active fin comprises a first portion and a second portion which are spaced apart from each other in the first direction with the capping pattern interposed therebetween.

9. The semiconductor device of claim 8, wherein the first lower source/drain pattern is provided on the first active fin, the second active fin and the first portion of the third active fin, and
 wherein the second lower source/drain pattern is provided on the first active fin, the second active fin and the second portion of the third active fin.

10. The semiconductor device of claim 9, wherein the plurality of active fins further comprises a fourth active fin spaced apart from the second portion of the third active fin in the second direction,
wherein the fourth active fin is provided adjacent the capping pattern in the first direction, and
wherein the second lower source/drain pattern extends from a top surface of the second portion of the third active fin to a top surface of the fourth active fin.

11. The semiconductor device of claim 1, further comprising:
an insulating layer provided between the first lower source/drain pattern and the second lower source/drain pattern, and between the first upper source/drain pattern and the second upper source/drain pattern,
wherein the first lower source/drain pattern and the second lower source/drain pattern are spaced apart from the first upper source/drain pattern and the second upper source/drain pattern along the third direction with the insulating layer interposed therebetween, and
wherein the insulating layer extends along a side surface of the first lower source/drain pattern and both side surfaces of the second lower source/drain pattern.

12. A semiconductor device comprising:
an active pattern extending in a first direction on a substrate;
a first lower source/drain pattern provided on the active pattern;
a second lower source/drain pattern provided on the active pattern and spaced apart from the first lower source/drain pattern in the first direction;
a first upper source/drain pattern provided on the first lower source/drain pattern;
a second upper source/drain pattern provided the second lower source/drain pattern;
a gate electrode crossing the active pattern and extending in a second direction intersecting the first direction;
a first channel pattern extending in the first direction to cross the gate electrode, and connecting the first lower source/drain pattern and the second lower source/drain pattern;
a second channel pattern extending in the first direction to cross the gate electrode, and connecting the first upper source/drain pattern and the second upper source/drain pattern;
a common contact commonly connected to the first lower source/drain pattern and the first upper source/drain pattern;
a bottom contact connected to the second lower source/drain pattern;
a top contact connected to the second upper source/drain pattern; and
a gate contact contacting the gate electrode,
wherein at least one of the first channel pattern and the second channel pattern comprises a plurality of semiconductor patterns stacked and spaced apart from each other in a third direction perpendicular to a top surface of the substrate,
wherein a length, in the second direction, of each of the first upper source/drain pattern and the second upper source/drain pattern is less than a length, in the second direction, of each of the first lower source/drain pattern and the second lower source/drain pattern,
wherein the gate electrode comprises an overlapping portion overlapping the active pattern along the third direction, and
wherein a length of the overlapping portion in the second direction is less than the length of the first lower source/drain pattern in the second direction.

13. The semiconductor device of claim 12, wherein the common contact comprises:
a first portion contacting a top surface of the first lower source/drain pattern; and
a second portion contacting a top surface of the first upper source/drain pattern, and
wherein the second portion of the common contact overlaps the gate electrode in the first direction.

14. The semiconductor device of claim 13, wherein the first portion of the common contact contacts a side surface of the first upper source/drain pattern.

15. The semiconductor device of claim 12, further comprising a bottom contact spacer provided on a side surface of the bottom contact,
wherein the bottom contact is spaced apart from the top contact in the second direction with the bottom contact spacer interposed therebetween.

16. The semiconductor device of claim 12, further comprising a capping pattern contacting a top surface and a side surface of the gate electrode and extending in the second direction,
wherein the capping pattern comprises:
a first portion provided on the top surface of the gate electrode; and
a second portion connected to the first portion, and provided on the side surface of the gate electrode and the top surface of the substrate, and
wherein the bottom contact overlaps the second portion of the capping pattern in the first direction.

17. The semiconductor device of claim 12, further comprising:
a first insulating layer provided on side surfaces of each of the first lower source/drain pattern and the second lower source/drain pattern; and
a second insulating layer between the first lower source/drain pattern and the first upper source/drain pattern, and between the second lower source/drain pattern and the second upper source/drain pattern,
wherein the second insulating layer extends along a side surface of the first lower source/drain pattern and both side surfaces of the second lower source/drain pattern, and
wherein the first insulating layer comprises a first insulating material and the second insulating layer comprises a second insulating material that is different from the first insulating material.

18. A semiconductor device comprising:
a substrate comprising a first region, a second region, and a third region between the first region and the second region;
an active pattern extending in a first direction on the substrate;
a first lower source/drain pattern provided on the active pattern;
a second lower source/drain pattern provided on the active pattern and spaced apart from the first lower source/drain pattern in the first direction;
a first upper source/drain pattern provided on the first lower source/drain pattern;
a second upper source/drain pattern provided on the second lower source/drain pattern; and
a gate electrode crossing the active pattern on the third region and extending in a second direction intersecting the first direction, wherein the active pattern has a first length in the second direction on the first region, wherein the active pattern has a second length in the second direction on the second region, wherein the active pattern has a third length in the second direction on the third region, and wherein the third length is less than the first length and the second length.

19. The semiconductor device of claim 18, wherein the first length is less than the second length.

20. The semiconductor device of claim 19, wherein a length, in the second direction, of each of the first upper source/drain pattern and the second upper source/drain pattern is less than the first length.

* * * * *